United States Patent [19]

Nakanishi et al.

[11] Patent Number: 4,947,085
[45] Date of Patent: Aug. 7, 1990

[54] PLASMA PROCESSOR

[75] Inventors: Koichiro Nakanishi; Hiroki Ootera; Minoru Hanazaki; Toshihiko Minami, all of Amagasaki, Japan

[73] Assignee: Mitsubishi Denki Kabushiki Kaisha, Japan

[21] Appl. No.: 173,147

[22] Filed: Mar. 25, 1988

[30] Foreign Application Priority Data

| Mar. 27, 1987 | [JP] | Japan | 62-75116 |
| Mar. 30, 1987 | [JP] | Japan | 62-77133 |
| Mar. 30, 1987 | [JP] | Japan | 62-77134 |
| May 1, 1987 | [JP] | Japan | 62-106409 |
| May 6, 1987 | [JP] | Japan | 62-111512 |
| Jun. 18, 1987 | [JP] | Japan | 62-150153 |

[51] Int. Cl.$^5$ .................. H05H 1/18; H05H 1/30; H01L 21/306
[52] U.S. Cl. .................. 315/111.41; 204/298.16; 204/298.18; 118/50.1
[58] Field of Search .......... 315/111.01, 111.21, 315/111.41, 111.71, 111.81, 344; 313/231.31, 231.61, 362.1; 118/719, 620, 621, 50.1; 204/298 ME, 298 FP, 298 SG, 298 CM; 250/423 R, 427; 219/121.36

[56] References Cited

U.S. PATENT DOCUMENTS

| 3,614,525 | 10/1971 | Uleski | 315/111.41 X |
| 4,401,054 | 8/1983 | Matsuo et al. | 118/50.1 X |
| 4,430,138 | 2/1984 | Suzuki et al. | 156/345 |
| 4,438,368 | 3/1984 | Abe et al. | 315/111.41 X |
| 4,543,465 | 9/1985 | Sakudo et al. | 315/111.41 X |
| 4,553,256 | 11/1985 | Moses | 315/111.41 X |
| 4,600,492 | 7/1986 | Ooshio et al. | 204/298 |
| 4,631,106 | 12/1986 | Nakazato et al. | 156/345 |
| 4,713,585 | 12/1987 | Ohno et al. | 315/111.81 |
| 4,714,536 | 12/1987 | Freeman et al. | 204/298 |
| 4,721,553 | 1/1988 | Saito et al. | 204/298 ME |
| 4,734,621 | 3/1988 | Yonnet et al. | 315/111.41 |
| 4,739,169 | 4/1988 | Kurosawa et al. | 250/427 X |
| 4,795,529 | 1/1989 | Kawasaki et al. | 118/50.1 X |
| 4,829,215 | 5/1989 | Kim et al. | 315/111.41 |

FOREIGN PATENT DOCUMENTS

| 3729347 | 3/1988 | Fed. Rep. of Germany | 313/231.31 |
| 2592518 | 7/1987 | France |  |
| 50-9545 | 4/1975 | Japan |  |
| 0185968 | 8/1986 | Japan | 315/111.81 |
| 0065623 | 3/1988 | Japan | 313/231.31 |

OTHER PUBLICATIONS

Idehara et al., "Generation of a Highly Magnetized Plasma by Using the Superconducting Coil", J. Appl. Phys., vol. 52, No. 5, May 1981, pp. 3276-3278.

Primary Examiner—Eugene R. LaRoche
Assistant Examiner—Seung Ham
Attorney, Agent, or Firm—Leydig, Voit & Mayer

[57] ABSTRACT

A plasma processor wherein a substrate is processed using a plasma in a reaction gas generated through electron cyclotron resonance includes a magnetostatic field generator for generating a magnetostatic field, an electric field generator for generating an r.f. electric field perpendicular to the magnetostatic field, and a moving magnetic field generator for generating a moving magnetic field which intersects the magnetostatic field between the magnetostatic field generator and the substrate.

10 Claims, 24 Drawing Sheets

FIG. I (PRIOR ART)
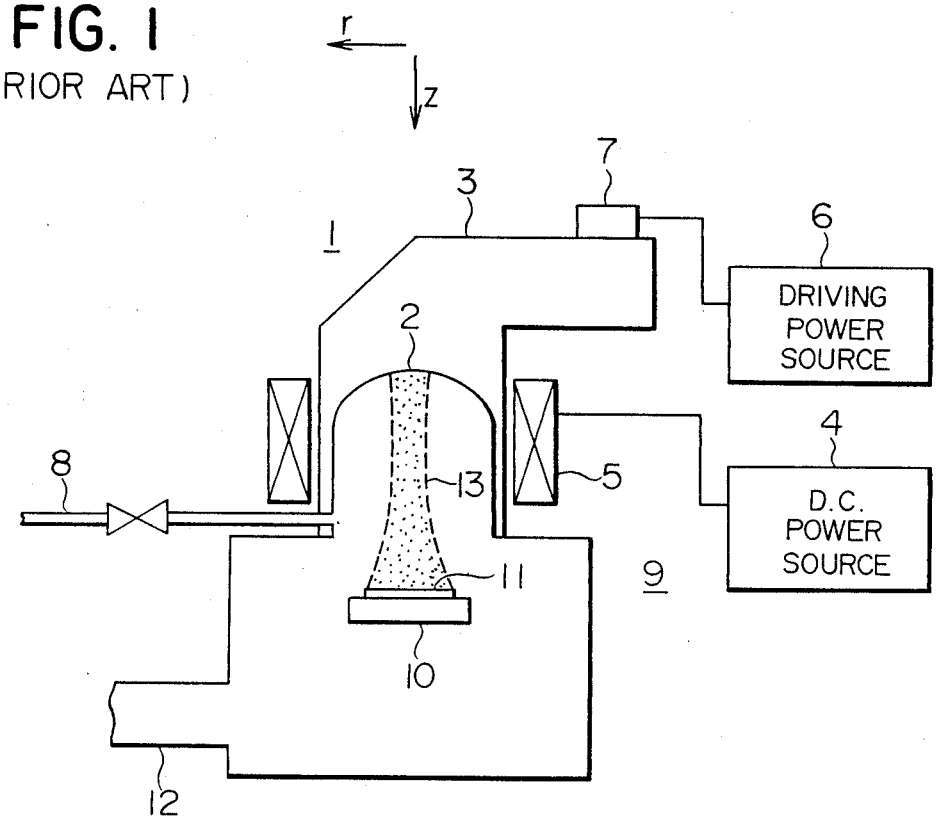
FIG. 2 (PRIOR ART)
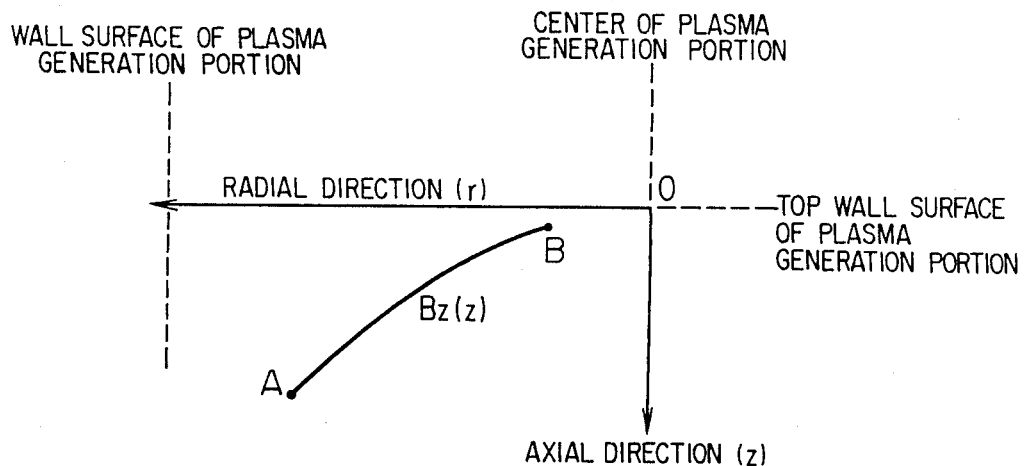

PLASMA PROCESSOR

BACKGROUND OF THE INVENTION

This invention relates to a plasma processor which is a semiconductor fabrication apparatus, and more particularly to a plasma processor which generates a plasma by the use of electron cyclotron resonance and which can effect a uniform plasma process over a large area of a substrate without the contamination of the substrate ascribable to the sputtering of walls by the plasma.

FIG. 1 is a sectional view, partly in blocks, showing the construction of an example of a prior-art plasma processor disclosed in Japanese Patent Application Laid-open No. 79621/1982. The prior-art plasma processor comprises a plasma generation portion 1. This plasma generation portion 1 has a plasma generating vessel, for example, glass tube 2; radio-frequency electric field formation means, for example, a radio-frequency waveguide 3 which accommodates the plasma generating glass tube 2 and which generates a nonuniform r.f. electric field perpendicular to an axial direction (assumed to be the z-direction); and magnetostatic generation means, for example, a solenoid coil 5 which is arranged around the r.f. waveguide 3 and which is connected to a D.C. power source 4 to generate a nonuniform magnetostatic field in the axial direction. Radio-frequency power is fed to the r.f. waveguide 3 through a magnetron 7 which is mounted on the upper part of the r.f. waveguide 3 and which is connected to a driving power source 6. In addition, a gas, for example, a reaction gas, is fed to the plasma generating glass tube 2 through gas supply pipe 8.

The prior-art plasma processor further comprises a plasma reaction portion 9. In this plasma reaction portion 9, there is disposed a stage 10 on which a substrate 11 to be processed with a plasma is placed. The above mentioned gas supply pipe 8 is connected to the upper part of the plasma reaction portion 9. An exhaust pipe 12 for exhausting the used gas is connected to the lower part of the plasma reaction portion 9.

The prior-art plasma processor is constructed as stated above, and it forms the plasma on the basis of electron cyclotron resonance. Therefore, this electron cyclotron resonance will be explained below:

Here, B(z) denotes the intensity of the nonuniform magnetostatic field in the axial direction. The r.f. electric power fed into the r.f. waveguide 3 by the magnetron 7 establishes a nonuniform r.f. electric field $E_{rf}(z)$ within the plasma generation portion 1 which is so shaped as to resonate in accordance with the frequency of the r.f. power. The intensity of the magnetostatic field in the z-direction, which causes the electron cyclotron resonance with the r.f. electric field $E_{rf}(z)$ within the plasma generation portion 1, lies in a range within the plasma generation portion 1 as shown in FIG. 2. This figure is a distribution diagram showing resonance points in a radial direction r from the center of the plasma generation portion 1 to the side wall surface thereof and in the axial direction z below the top wall surface of the plasma generation portion 1. A curve from point A to point B is obtained by connecting the points of magnetic field intensities at which the magnetostatic field intensity $B_z(z)$ in the z-direction causes the resonance with the r.f. electric field $E_{rf}(z)$.

Electrons perform a well-known cyclotron motion in the magnetostatic field B, and the angular frequency $\omega_c$ of the cyclotron motion is expressed by $\omega_c = eB/m$ (where e denotes the absolute value of electronic charge, and m denotes the mass of the electron). Letting $\omega$ denote the angular frequency of the r.f. electric field $E_{rf}(z)$ in the plasma generation portion 1, when the cyclotron resonance condition of $\omega = \omega_c$ holds, the energy of the r.f. power is continuously supplied to an electron, and the energy of the electron increases.

Under such cyclotron resonance conditions, a gas of proper gaseous pressure is introduced into the gas supply pipe 8. The electrons generated in a preliminary discharge state are then continuously supplied with energy from the r.f. power. Therefore, the electrons attain a high energy state, and the plasma is developed through the process of collisions. The r.f. power is further supplied to the developed plasma under the resonance conditions.

Accordingly, assuming by way of example that the gas introduced through the gas supply pipe 8 is $SiH_4$, the r.f. power is properly adjusted in addition to the pressure of the gas, whereby the types, concentrations, and/or energy levels of respective ions such as $Si^+$, $SiH^+$, $SiH_2^+$ and $SiH_3^+$ can be controlled, and simultaneously, the types, concentrations, and/or energy levels of radicals such as $Si^*$ and $SiH_x^*$ can be controlled.

Meanwhile, an axial force $F_z$ given by the following equation acts on the electron in the presence of both the nonuniform magnetostatic field B(z) and the nonuniform electric field $E_{rf}(z)$, so that the electrons are accelerated in the axial direction:

$$F_z = -\mu \frac{dB}{dz} + \frac{\omega_0}{B_0} \cdot \frac{\frac{dB}{dz}}{\left(1 + \frac{m}{M}\right)}$$

where $\mu$ denotes a magnetic moment, B a magnetic flux density, z a distance in the axial direction, $\omega_0$ the energy of the circular motion of the electron, $B_0$ a magnetic flux density in the plasma generation portion 1, m the mass of the electron, and M the mass of the ion.

Accordingly, the electrons in the plasma generated by the plasma generation portion 1 in FIG. 1 are axially accelerated toward the plasma reaction portion 9. In consequence, an electrostatic field $E_0(z)$ which accelerates the ions is established in the axial direction within the plasma. This electrostatic field $E_0(z)$ accelerates the plasma as a whole in the axial direction, so that a plasma flow 13 extending in the axial direction appears in the plasma reaction portion 9. Since magnetic lines of forces created by the solenoid coil 5 have components in the r-direction in the plasma reaction portion 9, the plasma flow 13 spreads along the magnetic lines of force.

Such a plasma processor can be applied to various surface processes including plasma etching, plasma CVD and plasma oxidation, and can effectively perform these processes.

With the prior-art plasma processor utilizing electron cyclotron resonance, the intensities of the magnetostatic field $B_z(z)$ and the r.f. electric field $E_{rf}(z)$ are not uniform in the radial direction. This leads to the problem that, in general, uniformity in the plasma process is difficult to attain. By way of example, when a film is formed by the plasma CVD, the distribution of the thickness of the film becomes nonuniform, especially in the case of a substrate of large diameter, as illustrated in FIG. 3. This figure is a distribution diagram in which the abscissa represents the r-directional distance from the center of the substrate, while the ordinate represents the distribution of the thickness of the film.

Further, magnetic fluxes generated by the solenoid coil 5 flare within the plasma reaction portion 9 as illustrated in FIG. 4, so that the plasma flow 13 flares also. This leads to the problem that the plasma sputters the chamber walls defining the plasma reaction portion 9. Therefore, the substrate 11 might be contaminated with substances flying from the walls. Another problem is that, since the proportion of the plasma reaching the substrate lessens, the efficiency of the plasma process is reduced.

SUMMARY OF THE INVENTION

This invention has been made in order to solve the problems as stated above, and has for its object to provide a plasma processor which can uniformly process even a substrate of large diameter with a plasma.

Another object of this invention is to provide a plasma processor which can vary the diameter of a plasma flow.

Still another object of this invention is to provide a plasma processor which can prevent a plasma from diffusing.

Yet another object of this invention is to provide a plasma processor which avoids the contamination of a substrate ascribable to the sputtering of chamber walls and which affords a high rate of plasma processing.

In one aspect of performance, this invention resides in a plasma processor comprising magnetostatic field generation means for generating a magnetostatic field, r.f. electric field formation means for generating an r.f. electric field perpendicular to the magnetostatic field, and moving magnetic field generation means for generating a magnetic field and which moves which intersects the magnetostatic field between the magnetostatic field generation means and a substrate to-be-processed. The moving magnetic field generation means includes electromagnets which generate a magnetic field in a plasma generation portion or a plasma reaction portion between the magnetostatic field generation means and the substrate, and a power source device which energizes the electromagnets. The electromagnets and the power source device mentioned above may well be replaced with a permanent magnet and a rotary mechanism which rotates the permanent magnet. The rotary mechanism may be constructed of gears, or may well be constructed of rotary discs and a belt. Another form of the moving magnetic field generation means includes a plurality of magnetic substance plates which are made of a magnetic substance of high permeability and which generate magnetic fields in the plasma generation portion between the magnetostatic field generation means and the substrate, and a drive mechanism which reciprocates the magnetic substance plates in directions perpendicular to the axis of the magnetostatic field generation means. Still another form of the moving magnetic field generation means includes a plurality of magnetic substance plates which are made of a magnetic substance of high permeability and which generate magnetic fields around a space between a plasma lead-out port and the substrate inside the plasma reaction portion, and a drive mechanism which drives the magnetic substance plates.

In another aspect of performance, this invention resides in a plasma processor comprising magnetostatic field generation means for generating a magnetostatic field, r.f. electric field formation means for generating an r.f. electric field which is perpendicular to the magnetostatic field, and a superconductor which is arranged around the plasma reaction portion where a plasma reacts. The superconductor is a high-temperature superconductor.

BRIEF DESCRIPTION OF THE DRAWINGS:

FIG. 1 is a sectional view, partly in blocks, showing the construction of a prior-art plasma processor;

FIG. 2 is a distribution diagram showing resonance points in a radial direction from the center of a plasma generation portion to the side wall surface thereof and in an axial direction below the top wall surface of the plasma generation portion within the prior-art plasma processor;

PREFERRED EMBODIMENTS OF THE INVENTION:

Now, embodiments of this invention will be described in detail with reference to the accompanying drawings.

Figure 5:
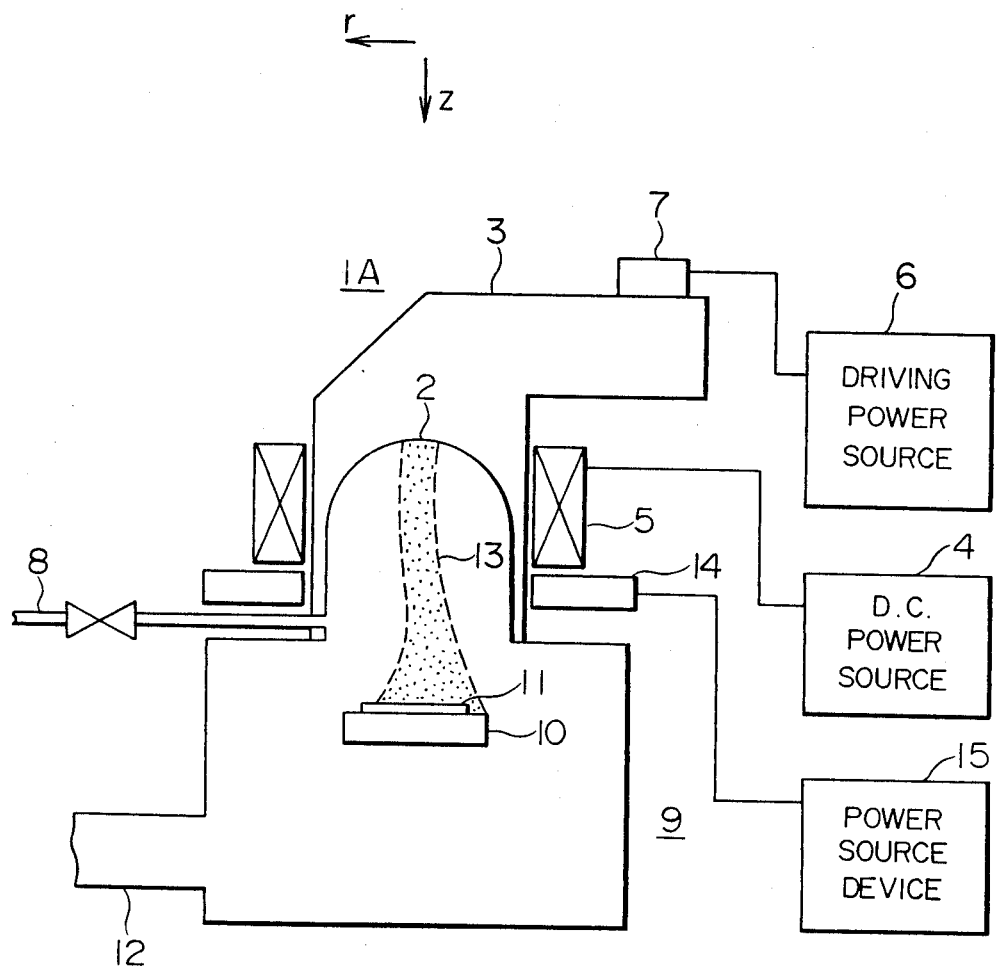
FIG. 5 is a sectional view, partly in blocks, showing the construction of the first embodiment of this invention.

FIG. 5 is a sectional view, partly in blocks, showing the construction of the first embodiment of a plasma processor according to this invention. In the first embodiment, a plasma generation portion 1A includes a plasma generating glass tube 2, an r.f. waveguide 3 and a solenoid coil 5, and at least one pair (in the first embodiment, four pairs as will be clarified later) of electromagnets 14 which are arranged around the r.f. waveguide 3 on the side of the solenoid coil 5 closer to a substrate 11 forming N-poles and S-poles. These electromagnets 14 are connected to a power source device 15 for successively causing currents of different phases to flow through the respective electromagnets, whereby moving magnetic field generation means is constructed. As in the prior-art processor, r.f. electric power is fed to the r.f. waveguide 3 through a magnetron 7 connected to a driving power source 6, the solenoid coil 5 is connected to a D.C. power source 4, and the plasma generating glass tube 2 is fed with a gas through a gas supply pipe 8.

A plasma reaction portion 9 is quite the same as illustrated in FIG. 1. Numeral 10 indicates a stage, and numeral 12 an exhaust pipe.

Also in the plasma processor of this invention, a plasma is formed by electron cyclotron resonance. The electron cyclotron resonance in this invention, however, is induced by an r.f. electric field $E_{rf}(z)$ and a resultant magnetic field $B_z(z)$ which is established by the solenoid coil 5 and the four pairs of electromagnets 14.

If the resultant magnetic field $B_z$ is a nonuniform magnetic field, a force $F_z$ in an axial direction (z-direction) acting on an electron is expressed by the following equation similarly to the case of the prior-art processor:

$$F_z = -\mu \frac{dB}{dz} + \frac{\omega_0}{B_0} \cdot \frac{\frac{dB}{dz}}{\left(1 + \frac{m}{M}\right)}$$

Accordingly, the electrons in the plasma generated by the plasma generation portion 1A in FIG. 5 are axially accelerated toward the plasma reaction portion 9. In consequence, an electrostatic field $E_0(z)$ which accelerates ions is established in the axial direction within the plasma. This electrostatic field $E_0(z)$ accelerates the plasma as a whole in the axial direction, so that a plasma flow 13 extending in the axial direction appears in the plasma reaction portion 9.

Figure 6:
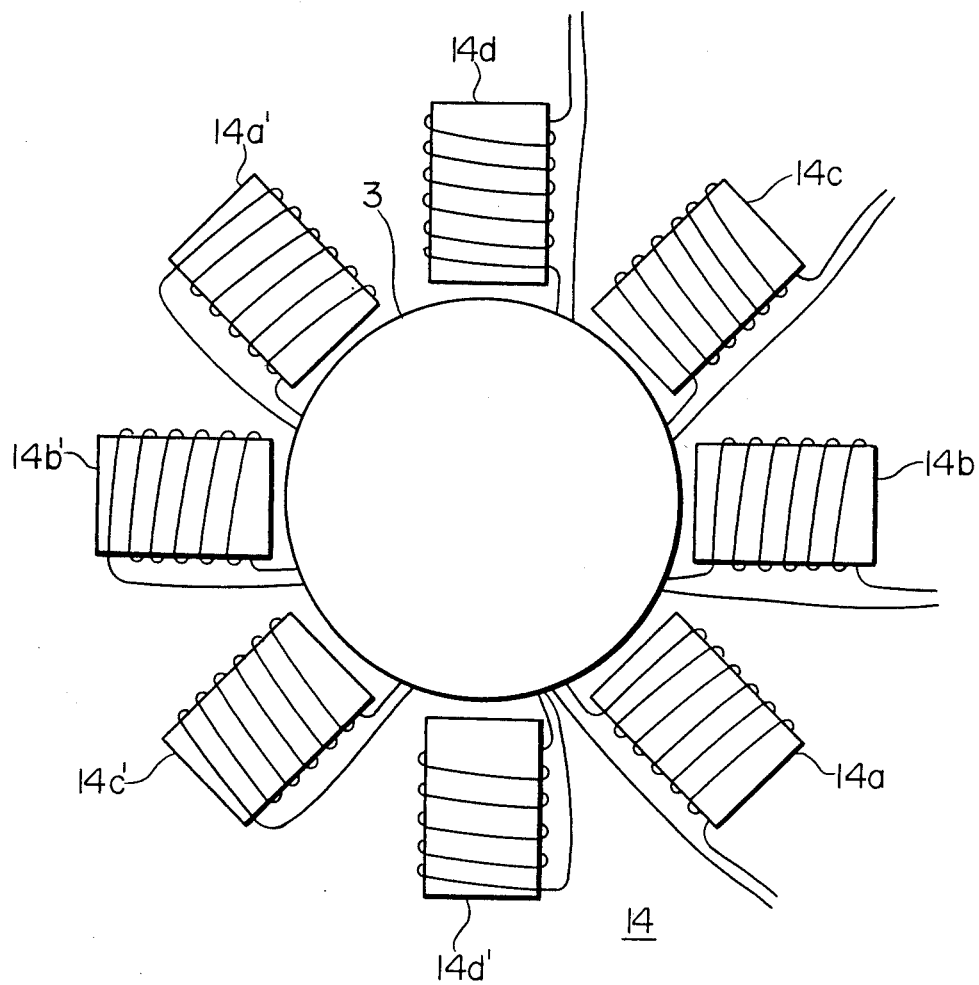
FIG. 6 is a plan view showing the arrangement of electromagnets which are used in the first embodiment.

FIG. 6 is a plan view showing the arrangement of the four pairs of electromagnets illustrated in FIG. 5. The four pairs of electromagnets 14a, 14a'; 14b, 14b'; 14c, 14c'; and 14d, 14d' are arranged around the r.f. waveguide 3 defining angles of 45° between the respectively adjacent pairs by way of example. FIGS. 7A-7H are waveform diagrams showing currents which are caused to flow through the four pairs of electromagnets 14a, 14a'; 14b, 14b'; 14c, 14c'; and 14d, 14d'. In each of these diagrams, the abscissa represents time, and the ordinate the current. In addition, arrows $H_R$ in FIGS. 8A-8D indicate magnetic fields which develop when the currents $i_a$, $i_b$, $i_c$ and $i_d$ shown in FIGS. 7A-7D are caused to flow through the electromagnet pairs 14a, 14a'; 14b, 14b'; 14c, 14c'; and 14d, 14d', respectively.

Figure 7A:
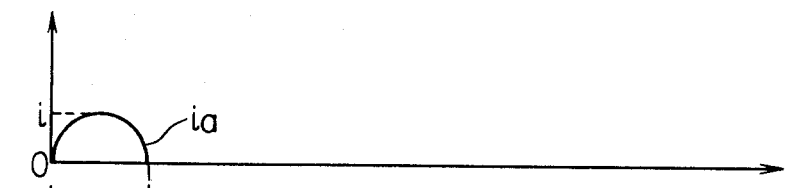
FIGS. 7A thru 7H are waveform diagrams showing the time variations of currents which are caused to flow through four pairs of electromagnets.
Figure 7B:
Figure 7C:
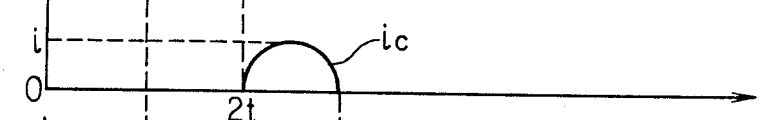
Figure 7D:
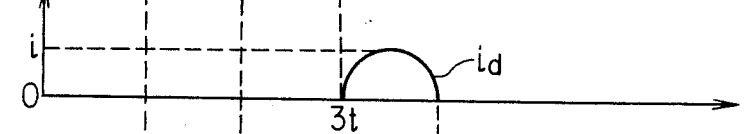
Figure 7E:
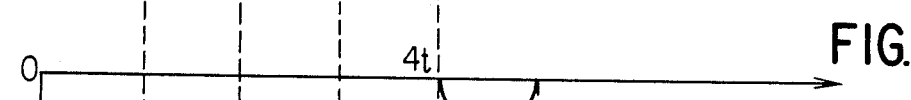
Figure 7F:
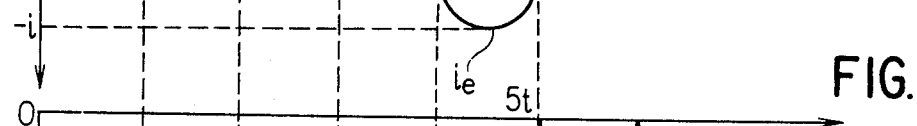
Figure 7G:
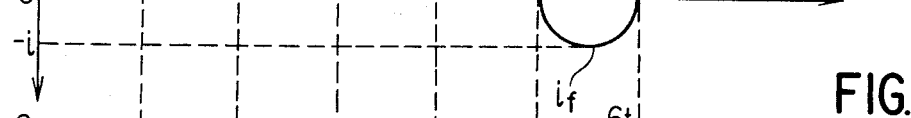
Figure 7H:
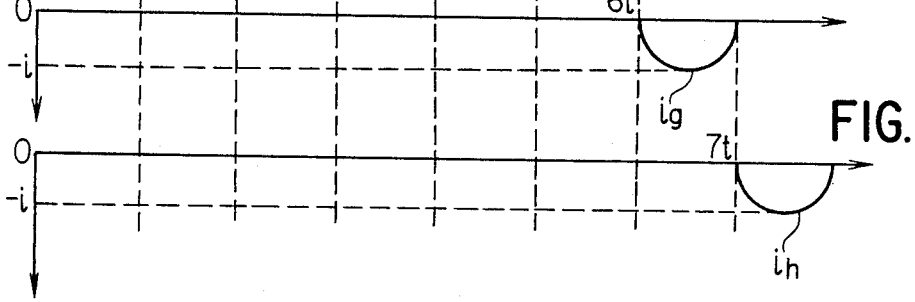
Figure 8A:
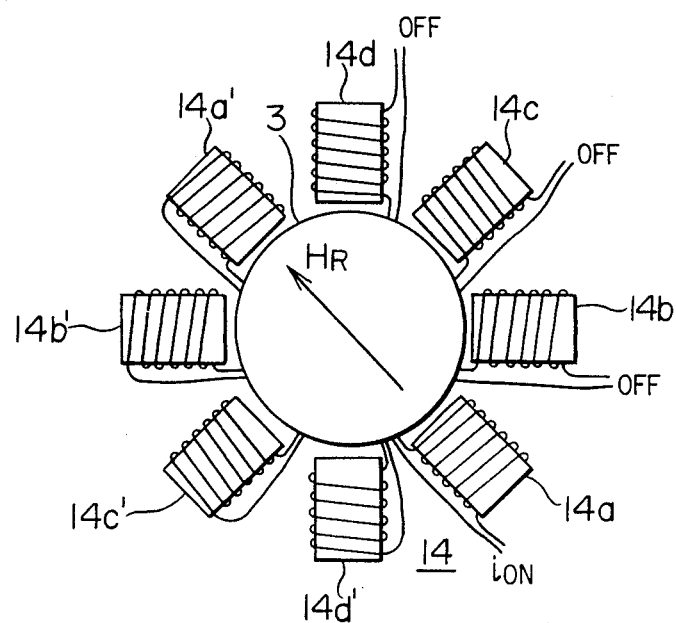
FIGS. 8A thru 8D are plan views showing the situation in which a magnetic field rotates when the currents are caused to flow through the electromagnets in succession.
Figure 8B:
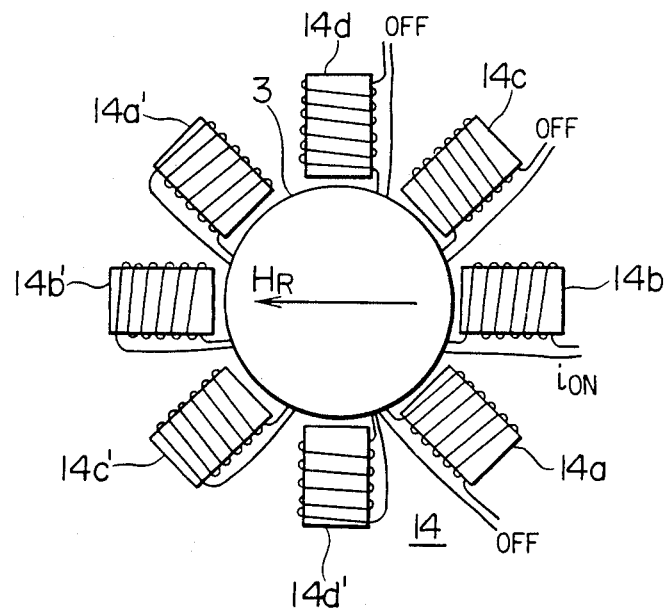
Figure 8C:
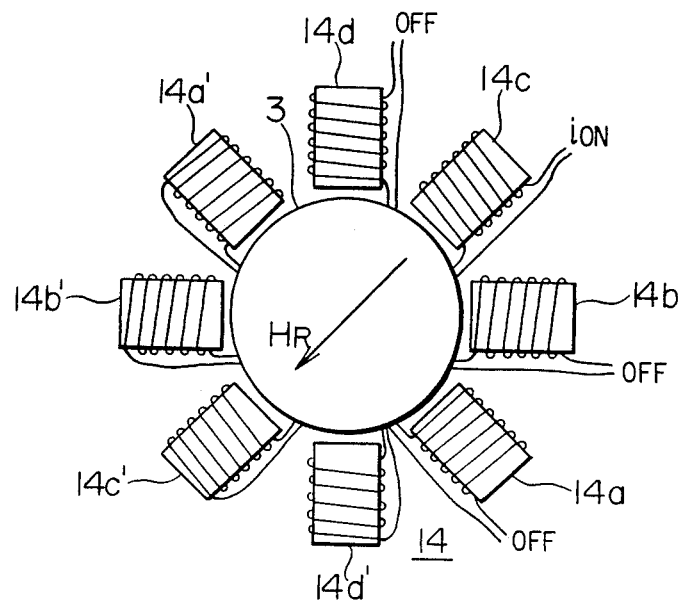
Figure 8D:
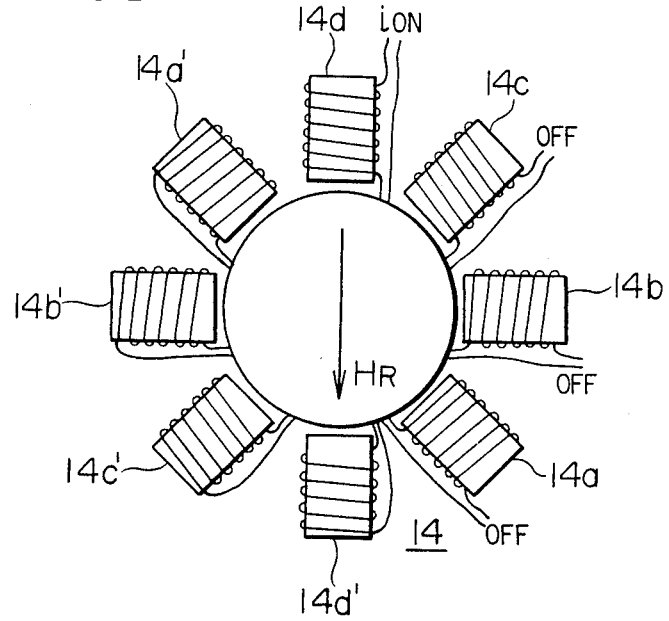

First, when the current $i_a$ shown in FIG. 7A is caused to flow through the electromagnets 14a, 14a' with the other electromagnets 14b, 14b'; 14c, 14c'; and 14d, 14d' turned OFF, the magnetic field $H_R$ is generated in a direction indicated in FIG. 8A. Subsequently, when the current $i_b$ shown in FIG. 7B is caused to flow through the electromagnets 14b, 4b' with the other electromagnets 14a, 14a'; 14c, 4c'; and 14d, 14d' turned OFF, the magnetic field $H_R$ is generated in a direction indicated in FIG. 8B and is rotated 45° from the direction of the magnetic field $H_R$ based on the electromagnets 14a, 14a'. Likewise, when the currents $i_c$ and $i_d$ shown in FIGS. 7C and 7D are successively caused to flow through the electromagnets 14c, 14c' and 14d, 14d', the directions of the magnetic fields $H_R$ are rotated at the angular intervals of 45° as indicated by the arrows in FIGS. 8C and 8D, respectively.

Further, when the currents $i_e$, $i_f$, $i_g$ and $i_h$ shown in FIGS. 7E-7H are respectively caused to flow through the electromagnets 14a, 14a'; 14b, 14b'; 14c, 14c'; and 14d, 14d' in succession, the generated magnetic fields $H_R$ are rotated 180° in an identical rotating direction. In this manner, when the currents shown in FIGS. 7A-7H are kept flowing, the magnetic fields $H_R$ continue to revolve.

Figure 9:
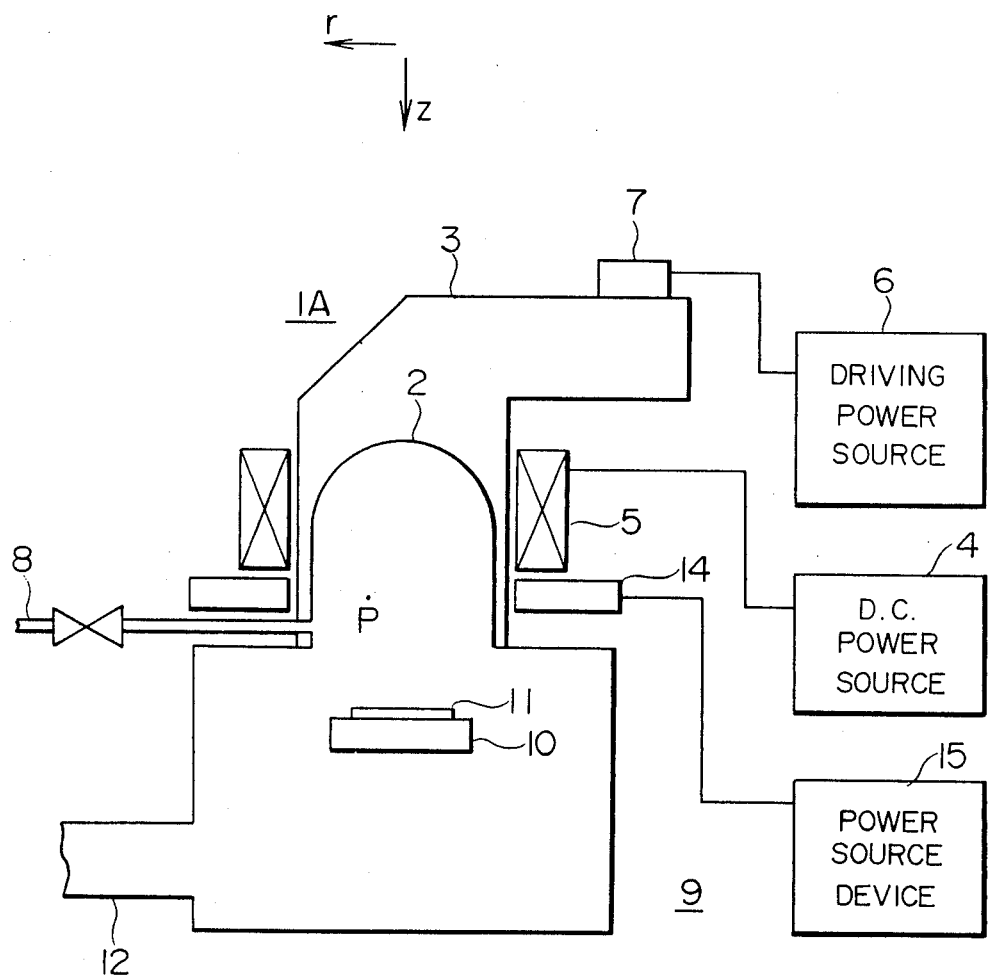
FIG. 9 is a sectional view of the construction of the first embodiment for indicating one point P in the plasma processor.
Figure 10A:
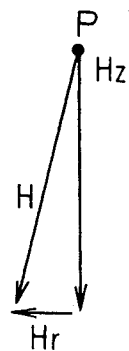
FIGS. 10A and 10B are vector diagrams of resultant magnetic fields developing when the currents are not flowing through the electromagnets and when they are flowing therethrough, respectively.

When current is caused to flow through the solenoid coil 5 with the electromagnets 14 deenergized, the intensity and direction of a magnetic field at the point P of the plasma generation portion 1A depicted in FIG. 9 become as illustrated in FIG. 10A. The intensity H of the magnetic field at the point P is the intensity of a resultant magnetic field composed of the intensity $H_z$ of a magnetic field in the z-axial direction and the intensity $H_r$ of a magnetic field in an r-direction (radial direction of the plasma generating portion 1A). In a case where the current is caused to flow through the solenoid coil 5 and where the current is also caused to flow through one pair of electromagnets, e.g., 14b, 14b' among the four pairs of electromagnets 14a, 14a'; 14b, 14b'; 14c, 14c'; and 14d, 14d', the point P is subjected to the magnetic fields established by the solenoid coil 5 and also to the magnetic field $H_R$ established by the pair of electromagnets 14b, 14b', and such a resultant magnetic field is illustrated in FIG. 10B.

Figure 10B:
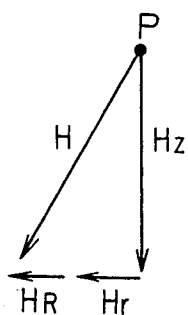

As seen from FIG. 10B, in the z-axial direction, the intensity $H_z$ of the magnetic field remains unchanged, but in the r-direction, the intensity of the resultant magnetic field H is such that the magnetic field $H_R$ established by the pair of electromagnets 14b, 14b' is added to the magnetic field $H_r$, and the resultant magnetic field H is swung in the r-direction more than in FIG. 10A. Although the point P in FIG. 9 has been referred to here, the senses of the lines of magnetic forces are changed by the resultant of the magnetic fields stated above, in a region where the magnetic field generated by one pair of electromagnets 14b, 14b' exists.

Figure 11:
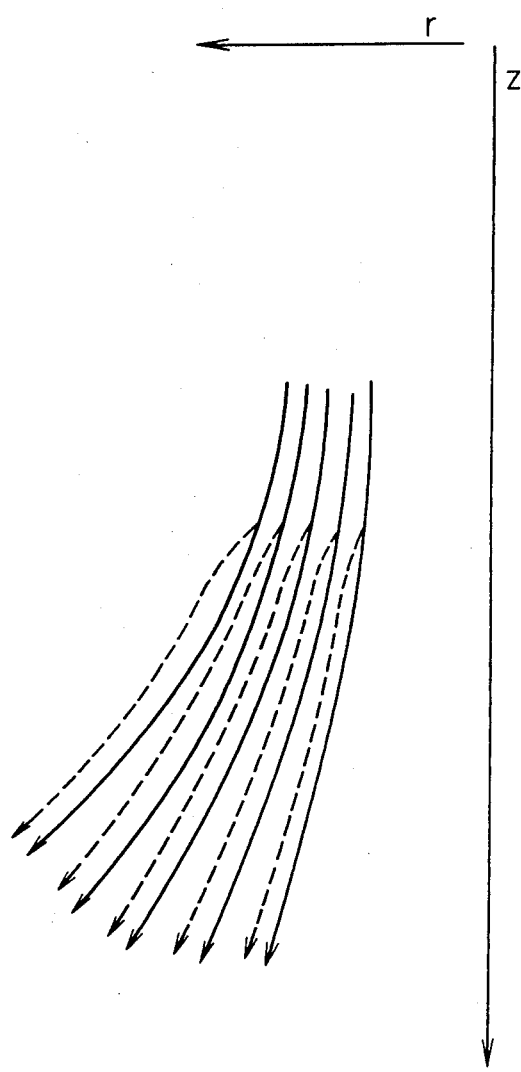
FIG. 11 is an explanatory diagram showing the situation in which the distribution of the lines of magnetic forces is changed by the magnetic field of the electromagnets.

FIG. 11 illustrates that the lines of magnetic forces are radially curved from solid lines to dotted lines by the magnetic field generated by one pair of electromagnets, so the distribution of the lines of magnetic forces is changed. In the figure, the lateral direction is the radial direction (r-direction), while the vertical direction is the axial direction (z-direction). In this manner, when the currents are successively caused to flow through the four pairs of electromagnets 14a, 14a'; 14b, 14b'; 14c, 14c'; and 14d, 14d', the magnetic fields $H_R$ revolve, so that locations where the senses of the lines of magnetic fields are changed, revolve to rotate the distributions of the lines of magnetic forces accordingly.

Thus, the plasma generated in the plasma generating portion 1A is led into the plasma reaction portion 9 by the electrostatic field $E_0(z)$ stated before, and in the plasma reaction portion 9, the plasma flow 13 is affected by the magnetic fields formed by the four pairs of electromagnets 14a, 14a'; 14b, 14b'; 14c, 14c'; and 14d, 14d' and has its axis shifted from the center axis of the solenoid coil 5 as illustrated in FIG. 5. Since the magnetic fields formed by the four pairs of electromagnets 14a, 14a'; 14b, 14b'; 14c, 14c'; and 14d, 14d' are rotated, the plasma flow 13 is also rotated about the z-axis with the same diameter and speed as those of the rotation of the magnetic fields. Owing to this operation, the plasma flow 13 is formed over a large extent of the substrate 11, thereby making it possible to perform a plasma process of large area and to perform a uniform plasma process.

Accordingly, assuming by way of example that the gas introduced through the gas supply pipe 8 is $SiH_4$, ions such as $Si^+$, $SiH^+$, $SiH_2^+$ and $SiH_3^+$ and radicals such as $Si^*$ and $SiH_x^*$ are created in the plasma generation portion 1A by the electron cyclotron resonance, the plasma is axially accelerated by the aforementioned electrostatic field $E_0(z)$, and the plasma flow 13 is rotated by the revolving magnetic field. In the plasma reaction portion 9, therefore, an amorphous silicon film having a uniform thickness distribution is formed on the substrate 11 of large diameter.

Figure 12:
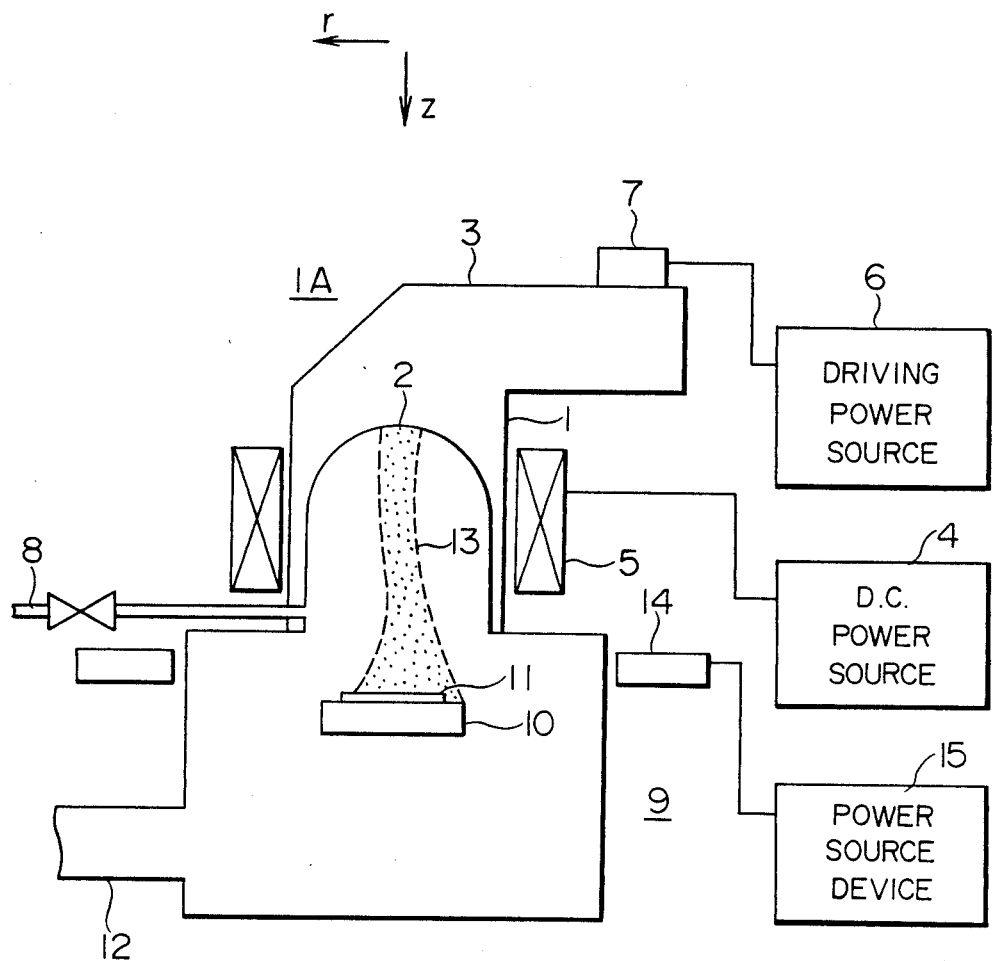
FIG. 12 is a sectional view, partly in blocks, showing the construction of a modification of the first embodiment shown in FIG. 5.

FIG. 12 is a sectional view, partly in blocks, showing the construction of a modification of the first embodiment illustrated in FIG. 5. The modification differs only in that the electromagnets 14 are disposed around the plasma reaction portion 9 between the substrate 11 and the solenoid coil 5.

This modification achieves effects similar to those of the first embodiment. More specifically, the plasma generated in the plasma generating portion 1A is led into the plasma reaction portion 9 by the electrostatic field $E_0(z)$. In the plasma reaction portion 9, the plasma flow 13 is affected by the magnetic fields formed by the four pairs of electromagnets 14a, 14a'; 14b, 14b'; 14c, 14c'; and 14d, 14d', and the axis of the plasma flow 13 deviates from the center axis of the solenoid coil 5 as illustrated in FIG. 12. Since the magnetic fields formed by the four pairs of electromagnets 14a, 14a'; 14b, 14b'; 14c, 14c'; and 14d, 14d' are rotated, the plasma flow 13 is also rotated about the z-axis with the same diameter and speed as those of the rotation of the magnetic fields. As in the first embodiment, this operation permits the plasma flow 13 to perform a plasma process over a large area and to perform a uniform plasma process.

The first embodiment has referred to the example in which the currents shown in FIGS. 7A–7H are caused to flow through the four pairs of electromagnets 14a, 14a'; 14b, 14b'; 14c, 14c'; and 14d, 14d' for the purpose of generating the revolving magnetic field, but the number of the electromagnets may be at least one pair. In this regard, the axial magnetic field is subjected to a rectilinear motion in case of one pair of electromagnets and to a rotating motion in case of two or more pairs of electromagnets.

Regarding the waveform of the currents, even when currents, having a waveform such as an A.C. half wave, triangular wave or pulse wave unlike the current waveform shown in FIGS. 7A–7H, are successively caused to flow through the electromagnets, effects similar to those of the first embodiment are achieved. Further, when the currents of different phases are successively caused to flow through the electromagnets, the currents of the adjacent electromagnets may well overlap. Essentially, the currents may be caused to flow to move the generated magnetic field.

The plasma processor according to this invention can be applied to various surface processes including plasma etching, plasma CVD and plasma oxidation, and can carry out a uniform process over a large extent.

Figure 13:
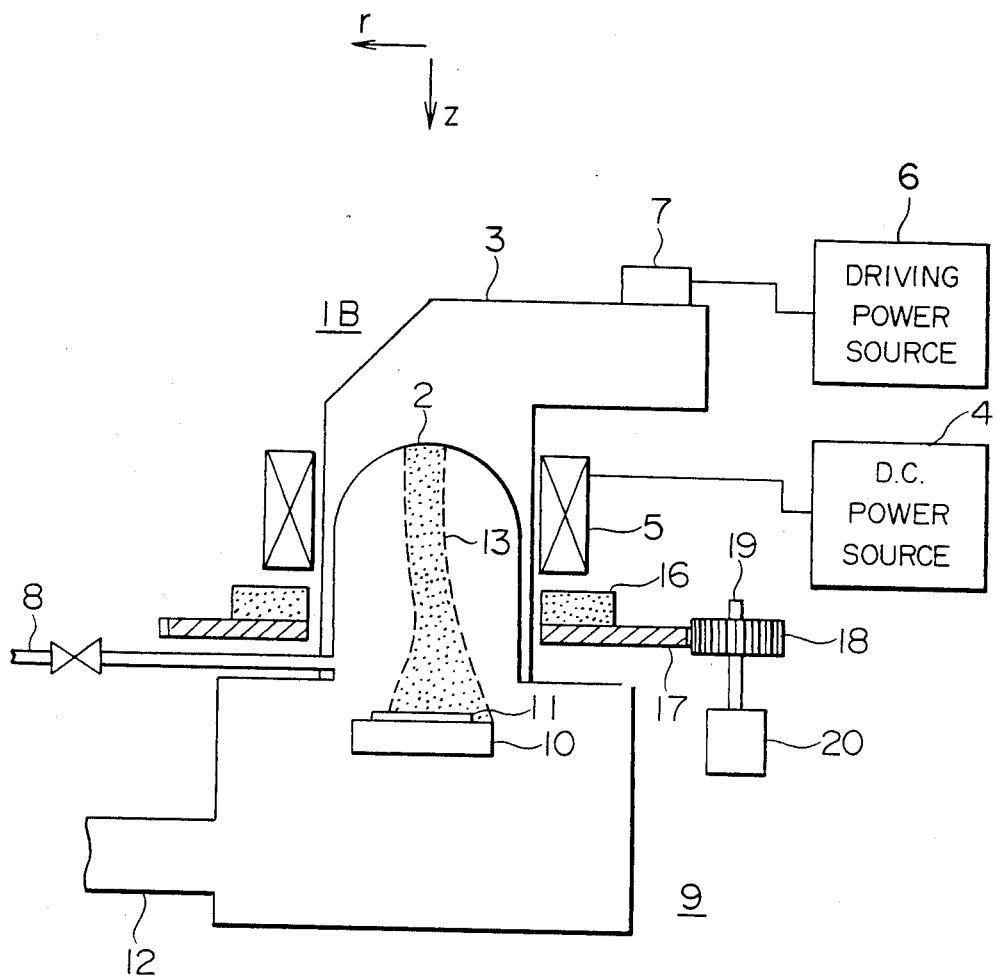
FIG. 13 is a sectional view, partly in blocks, showing the construction of the second embodiment of this invention.

FIG. 13 is a sectional view, partly in blocks, showing the construction of the second embodiment of this invention. In the second embodiment, a plasma generation portion 1B includes a plasma generating glass tube 2, an r.f. waveguide 3, a solenoid coil 5, a permanent magnet 16 which is arranged around the r.f. waveguide 3 and on the side of the solenoid coil 5 closer to a substrate 11, a rotatable gear 17 on which the permanent magnet 16 is placed, another gear 18 which rotates the gear 17, a rotary shaft 19 which is attached to the gear 18, and a rotation driver 20 which drives and rotates the rotary shaft 19. The permanent magnet 16, gears 17 and 18, rotary shaft 19, and rotation driver 20 constitute moving magnetic field generation means. As in the prior-art processor, r.f. electric power is fed to the r.f. waveguide 3 through a magnetron connected to a driving power source 6, the solenoid coil 5 is connected to a D.C. power source 4, and the plasma generating glass tube 2 is fed with a gas through a gas supply pipe 8.

A plasma reaction portion 9 is quite the same as illustrated in FIG. 1. Numeral 10 indicates a stage, and numeral 12 an exhaust pipe.

Also in the second embodiment, a plasma is formed by electron cyclotron resonance. The electron cyclotron resonance in this case, however, is induced by an r.f. electric field $E_{rf}(z)$ and a resultant magnetic field $B_z(z)$ which is established by the solenoid coil 5 and the permanent magnet 16 replacing the electromagnets 14 in the first embodiment. The method of generating a plasma flow 13 is as explained in the first embodiment.

Figure 14:
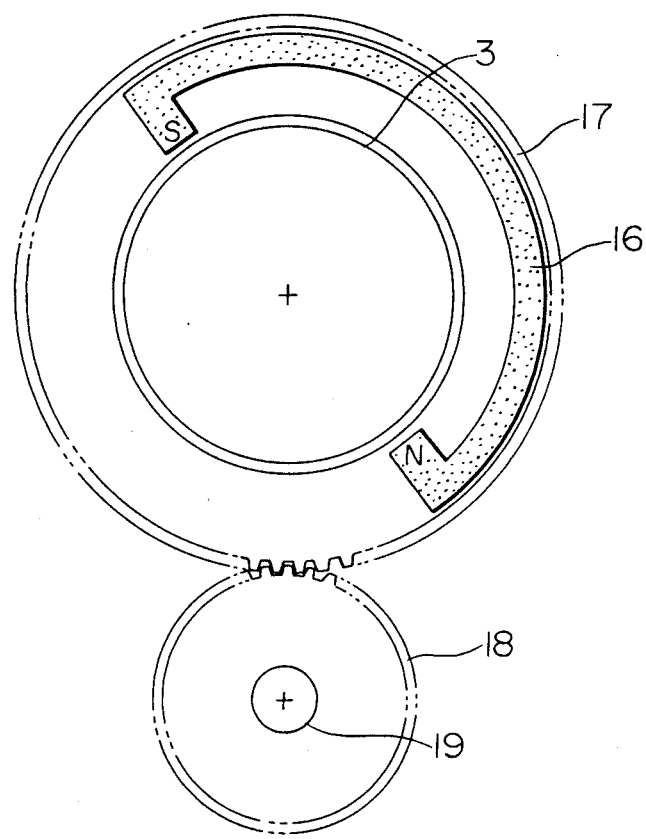
FIG. 14 is a plan view showing an example of a permanent magnet and a rotary mechanism therefor which are used in the second embodiment.

FIG. 14 is a plan view showing an example of the rotary mechanism for the permanent magnet illustrated in FIG. 13. The permanent magnet 16 is rotated around the r.f. waveguide 3 of the plasma generation portion 1B by the rotary mechanism. More specifically, when the rotation driver 20 is driven, the gear 18 connected thereto by the rotary shaft 19 is rotated, and the rotational motion is transmitted to the gear 17. Since the permanent magnet 16 is mounted on the gear 17, it executes a rotational motion along with the gear 17, and a revolving magnetic field develops in the plasma generation portion 1B. The state in which current is caused to flow through the solenoid coil 5 and in which the permanent magnet 16 is not rotated, is the same as described with reference to FIGS. 9, 10B and 11.

Figure 15:
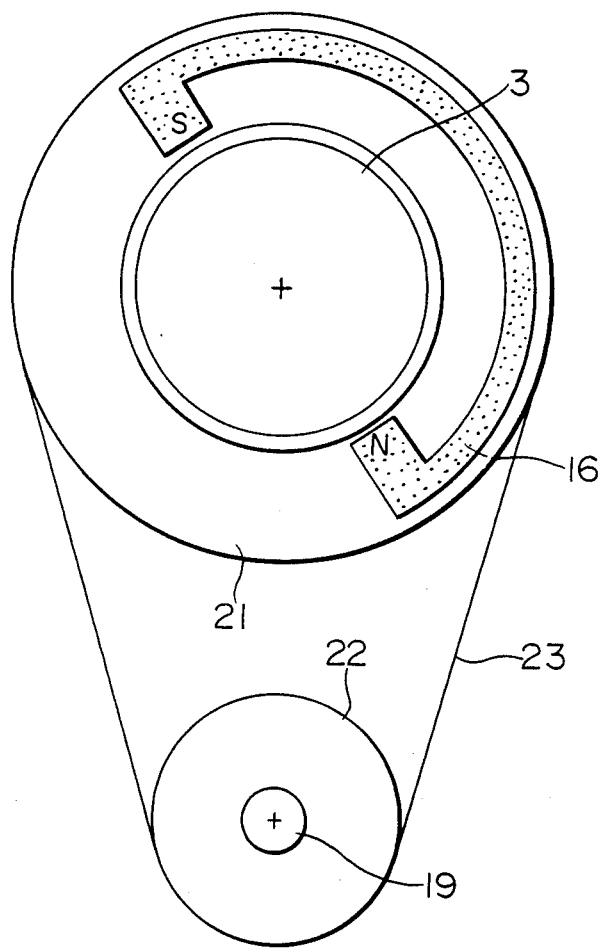
FIG. 15 is a plan view showing another example of the permanent magnet and the rotary mechanism therefor.

FIG. 15 is a plan view showing another example of the rotary mechanism. Here, two rotary discs 21 and 22 are connected by a belt 23 to rotate the permanent magnet 16 mounted on the rotary disc 21.

Figure 16:
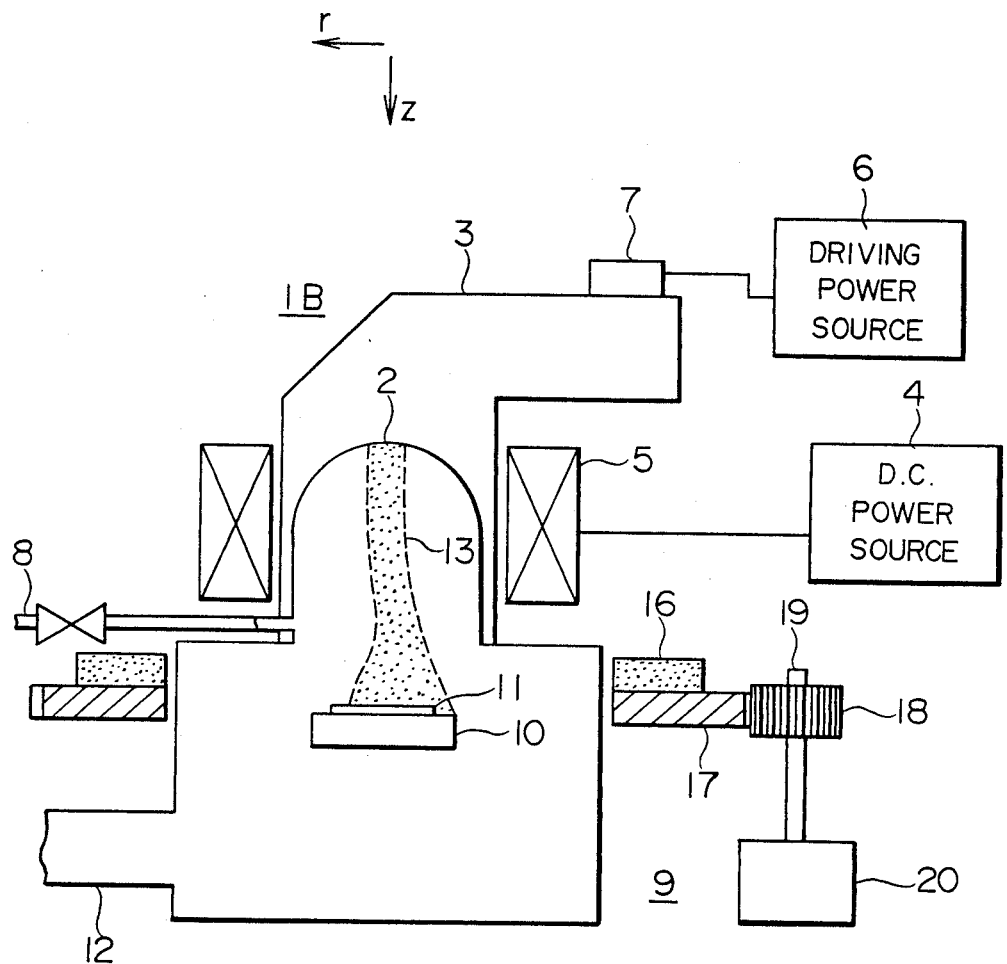
FIG. 16 is a sectional view, partly in blocks, showing the construction of a modification of the second embodiment shown in FIG. 13.

FIG. 16 is a sectional view, partly in blocks, showing a modification of the second embodiment illustrated in FIG. 13. This modification differs only in that the permanent magnet 16 and the rotary mechanism 17–20 therefor are disposed around the plasma reaction portion 9 between the substrate 11 and the solenoid coil 5.

Figure 17:
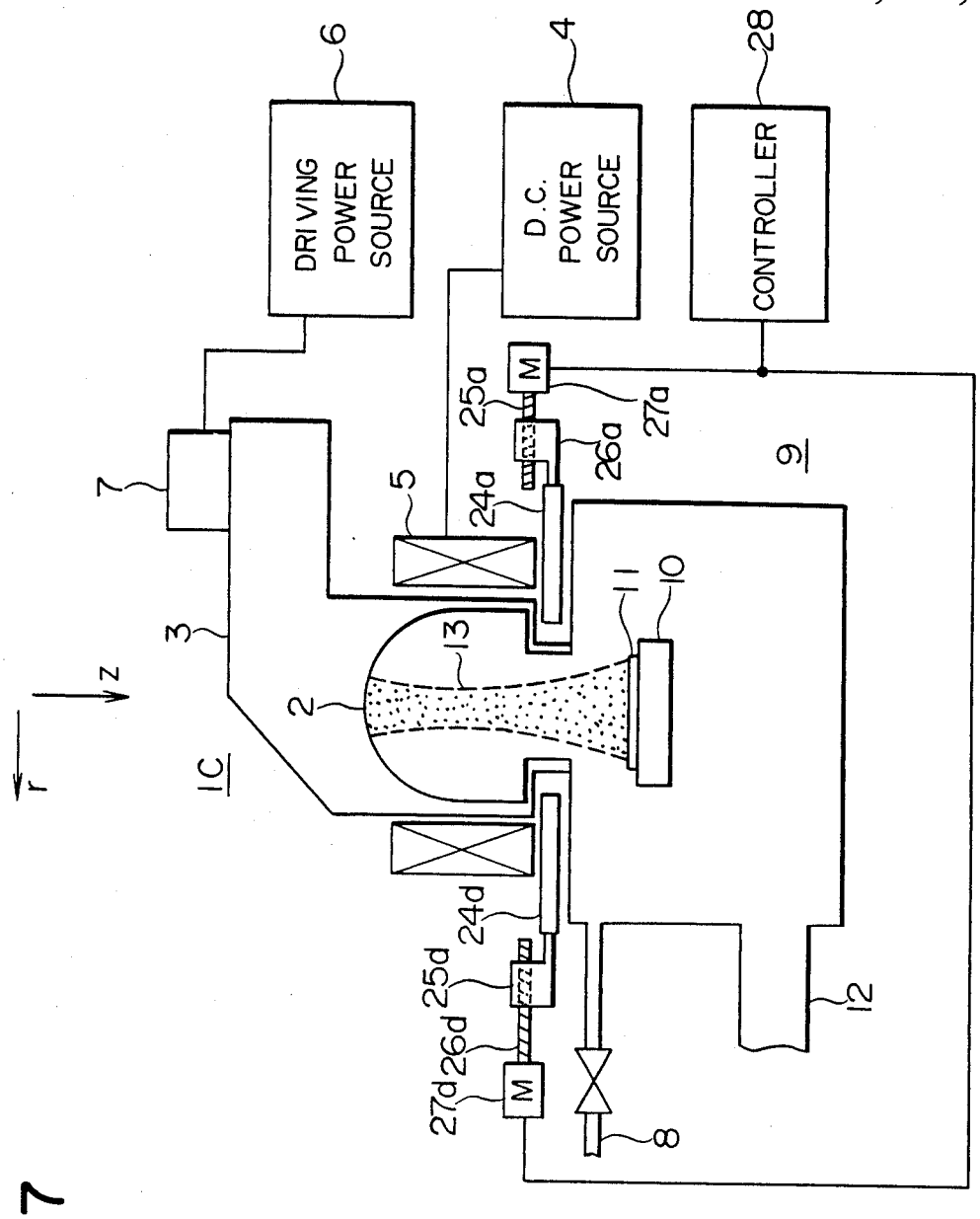
FIG. 17 is a sectional view, partly in blocks, showing the construction of the third embodiment of this invention.

FIG. 17 is a sectional view, partly in blocks, showing the construction of the third embodiment of this invention. In the third embodiment, a plasma generation portion 1C includes a plasma generating glass tube 2, an r.f. waveguide 3, a solenoid coil 5, a plurality of magnetic plates (only plates 24a and 24d are shown in FIG. 17) which are made of a magnetic substance of high permeability and which are arranged around the r.f. waveguide 3 on the side of the solenoid coil 5 closer to a substrate 11, movable supports, e.g., 26a, which are respectively connected to the magnetic plates and held in engagement with shafts, e.g., 25a, through screws and which serve to reciprocate the corresponding magnetic plates, e.g., 24a, in a direction perpendicular to the axis of the solenoid coil 5, namely, in an r-direction, driving motors, e.g., 27a, which have their output shafts (not shown) connected to the corresponding shafts, e.g., 25a to rotate these shafts, and a controller 28 which serves to control all the driving motors.

Figure 18:
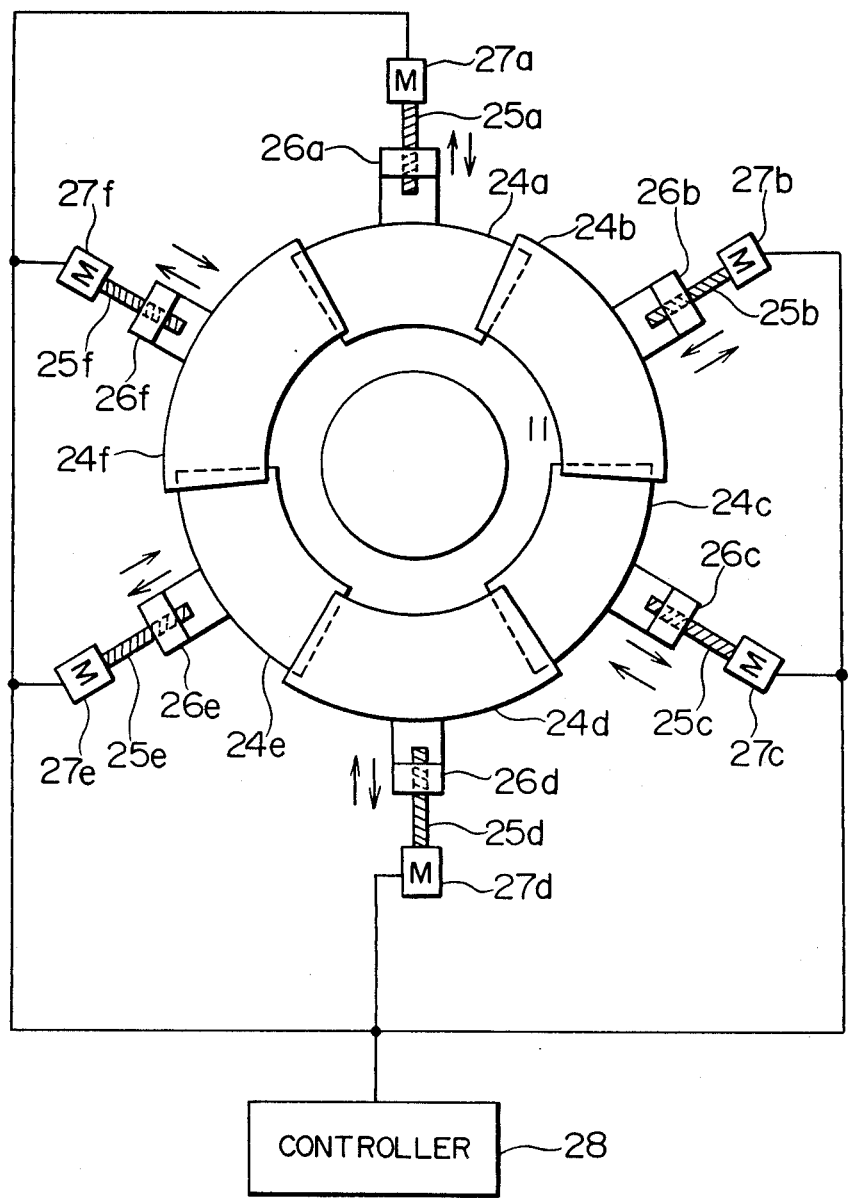
FIG. 18 is a plan view showing an example of magnetic plates and a drive mechanism therefor which are used in the third embodiment.

FIG. 18 is a plan view showing the arrangement of moving magnetic field generation means constructed of the high-permeability magnetic plates 24a–24f, shafts 25a–25f, movable supports 26a–26f, driving motors 27a–27f, and controller 28.

Figure 3:
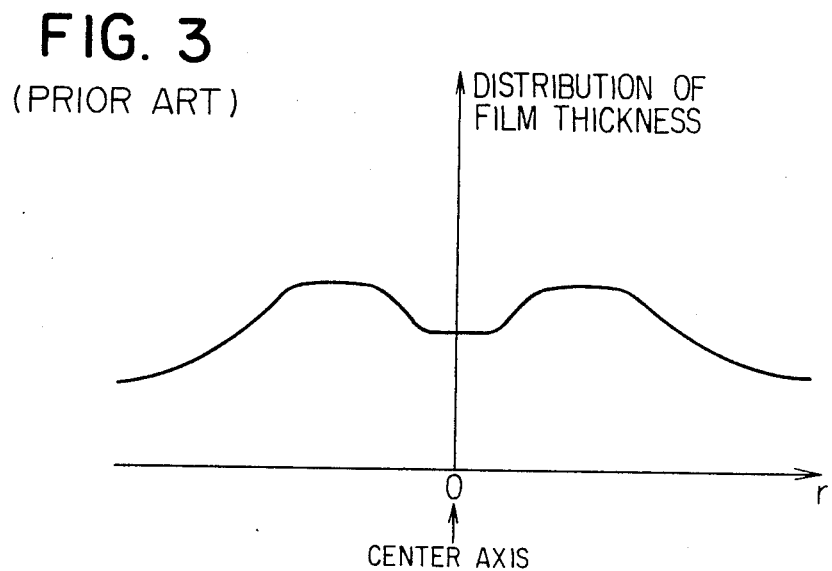
FIG. 3 is a diagram showing the distribution of the thicknesss of a thin film which is formed by the prior-art plasma processor.
Figure 4:
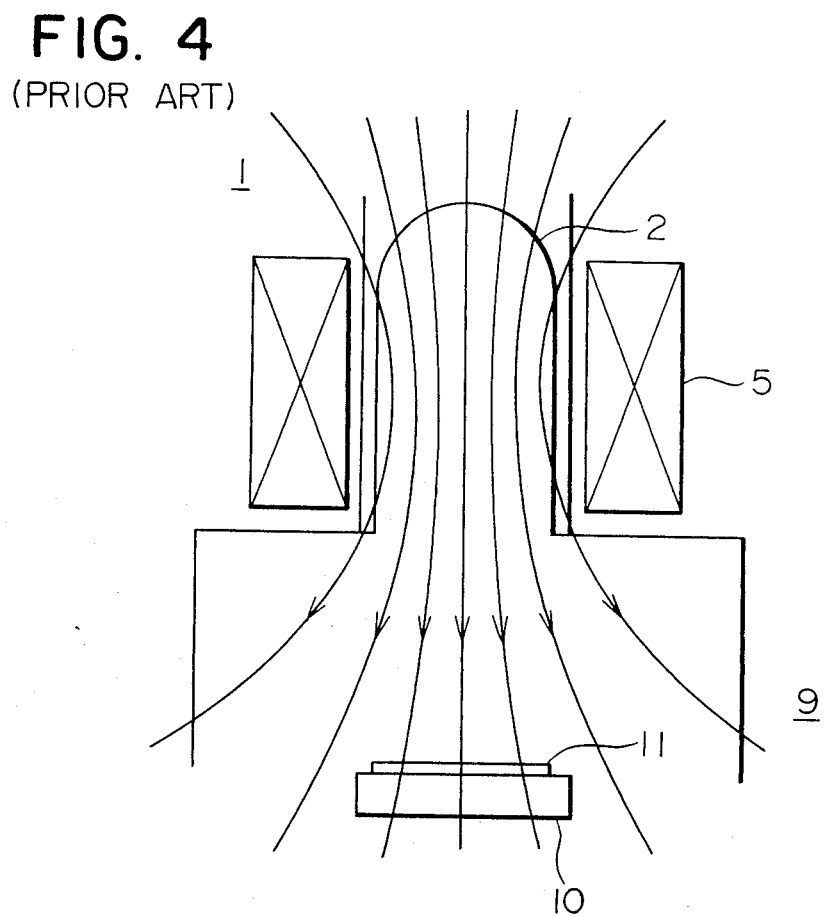
FIG. 4 is a distribution diagram showing the lines of magnetic forces near the plasma generation portion and plasma reaction portion of the prior-art plasma processor.
Figure 19:
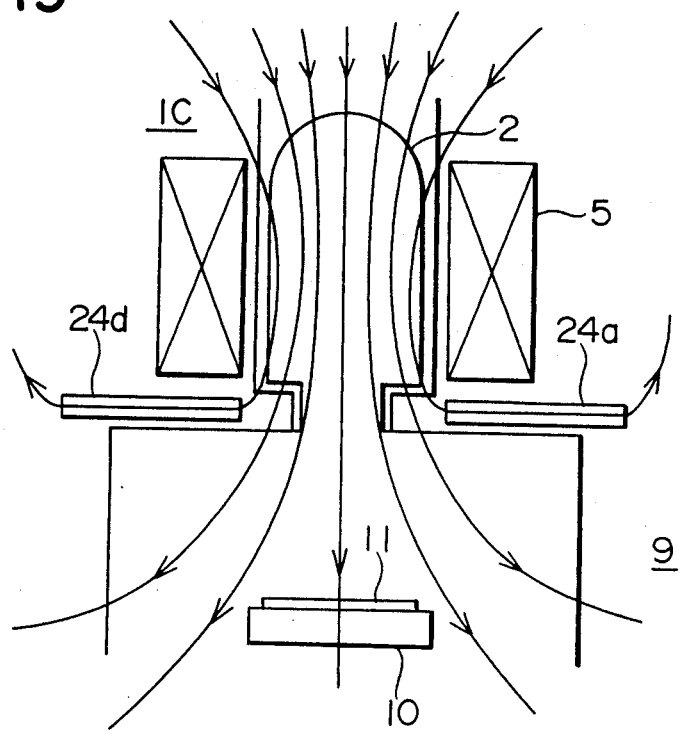
FIG. 19 is a diagram of the distribution of the lines of magnetic forces which develop when the magnetic plates lie on the outermost side.
Figure 20:
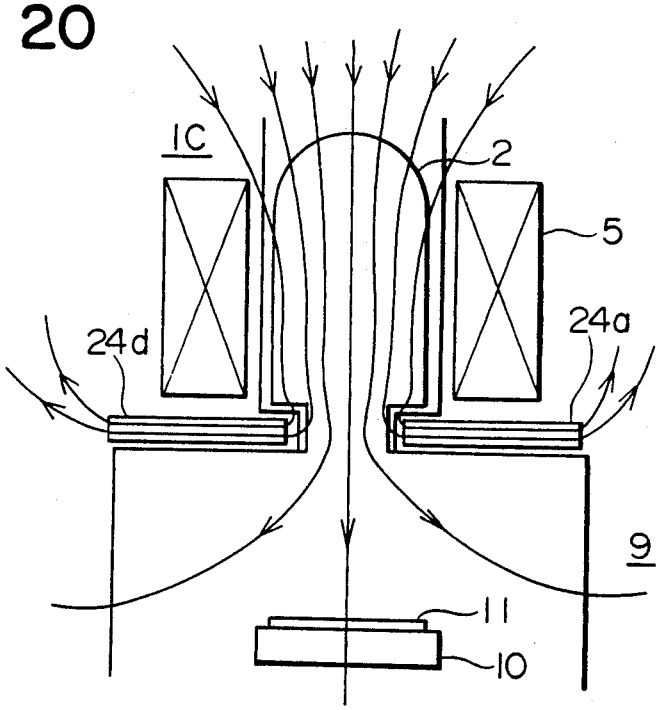
FIG. 20 is a diagram of the distribution of the lines of magnetic forces which develop when the magnetic plates lie on the innermost side.

In the absence of the high-permeability magnetic plates as in the prior-art plasma processor, the lines of magnetic forces near the plasma generation portion 1C and a plasma reaction portion 9 are distributed as illustrated in FIG. 4. In contrast, when the high-permeability magnetic plates 24a–24f are arranged around the r.f. waveguide 3 of the plasma generation portion 1C between the solenoid coil 5 and the substrate 11 as in the third embodiment stated above, some of the lines of magnetic forces pass through the magnetic plates of low reluctance 24a–24f, and the distribution of the lines of magnetic forces changes. Since a plasma flow 13 generated by electron cyclotron resonance is led into the plasma reaction portion 9 along the lines of magnetic forces, the diameter of the plasma flow 13 near the substrate 11 is also changed by the change of the distribution of the lines of magnetic forces. In a case where the magnetic plates 24a–24f are drawn to the outermost side by the driving motors 27a–27f, the lines of magnetic forces near the central part of the plasma generation portion 1C are hardly affected as illustrated in FIG. 19. Accordingly, the diameter of the plasma flow 13 in this case does not differ greatly from the diameter thereof in the absence of the magnetic plates. On the other hand, when the magnetic plates 24a–24f are located on the innermost side, even the lines of magnetic forces near the central part are affected, and the distribution of the lines of magnetic forces becomes as illustrated in FIG. 20. Accordingly, the diameter of the plasma flow 13 enlarges as compared with the diameter thereof arising when the magnetic plates 24a–24f are located on the outer side.

In this manner, according to the third embodiment, owing to the construction as shown in FIGS. 17 and 18, the magnetic plates 24a–24f are reciprocated in the r-direction by the driving motors 27a–27f to change the diameter of the plasma flow 13. By carrying out this motion as continuous reciprocations, the offset of the plasma flow 13 is eliminated, so that a uniform plasma process can be performed and even the substrate 11 of large diameter can be processed.

The third embodiment has referred to a construction which involves reciprocating the high-permeability magnetic plates 24a–24f. These magnetic plates 24a–24f are respectively furnished with the movable supports 26a–26f, shafts 25a–25f and driving motors 27a–27f, and the driving motors 27a–27f are controlled by the controller 28. However, insofar as the magnetic plates are moved in the r-direction, a structure shown in FIG. 21 may well be adopted by way of example.

Figure 21:
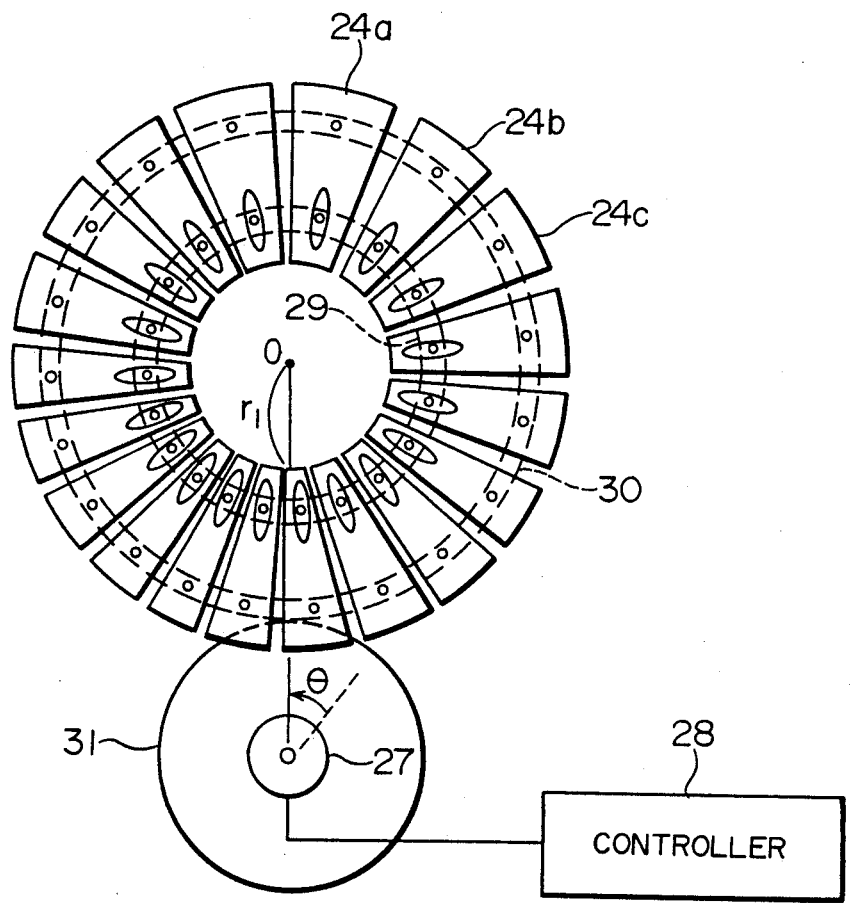
FIGS. 21 and 22 are plan views for showing another example of the magnetic plates and the drive mechanism therefor.
Figure 22:
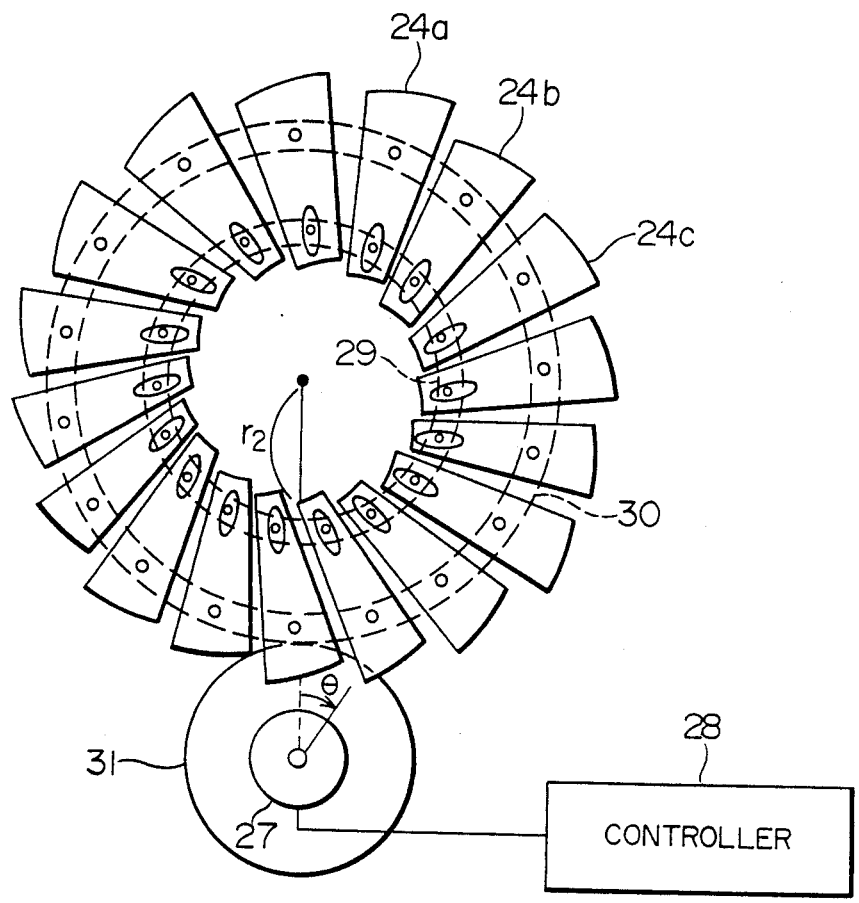

FIG. 21 is a plan view showing another example of the magnetic plates as well as the drive mechanism. The high-permeability magnetic plates 24a, 24b, . . . are attached to a stationary ring 29 and a movable ring 30. The movable ring 30 is connected to a single driving motor 27 through a gear 31, and the driving motor 27 is electrically connected to the controller 28. In operation, when the driving motor 27 is rotated a certain angle $\theta$ as indicated in FIG. 21 under the control of the controller 28, the magnetic plates 24a, 24b, . . . are rotated the angle $\theta$ in the reverse direction as illustrated in FIG. 22. Thereafter, the motor is rotated into the original state. These motions are repeated. When the driving motor 27 is rotated clockwise as shown in FIG. 21 and when it is rotated counterclockwise as shown in FIG. 22, the distances from the center 0 of the plasma generation portion 1C to the magnetic plates 24a, 24b, . . . become $r_1$ and $r_2$ ($r_1 < r_2$), respectively. Thus, the motions are equivalent in effect to moving the magnetic plates 24a, 24b, . . . in the radial direction (r-direction).

Figure 23:
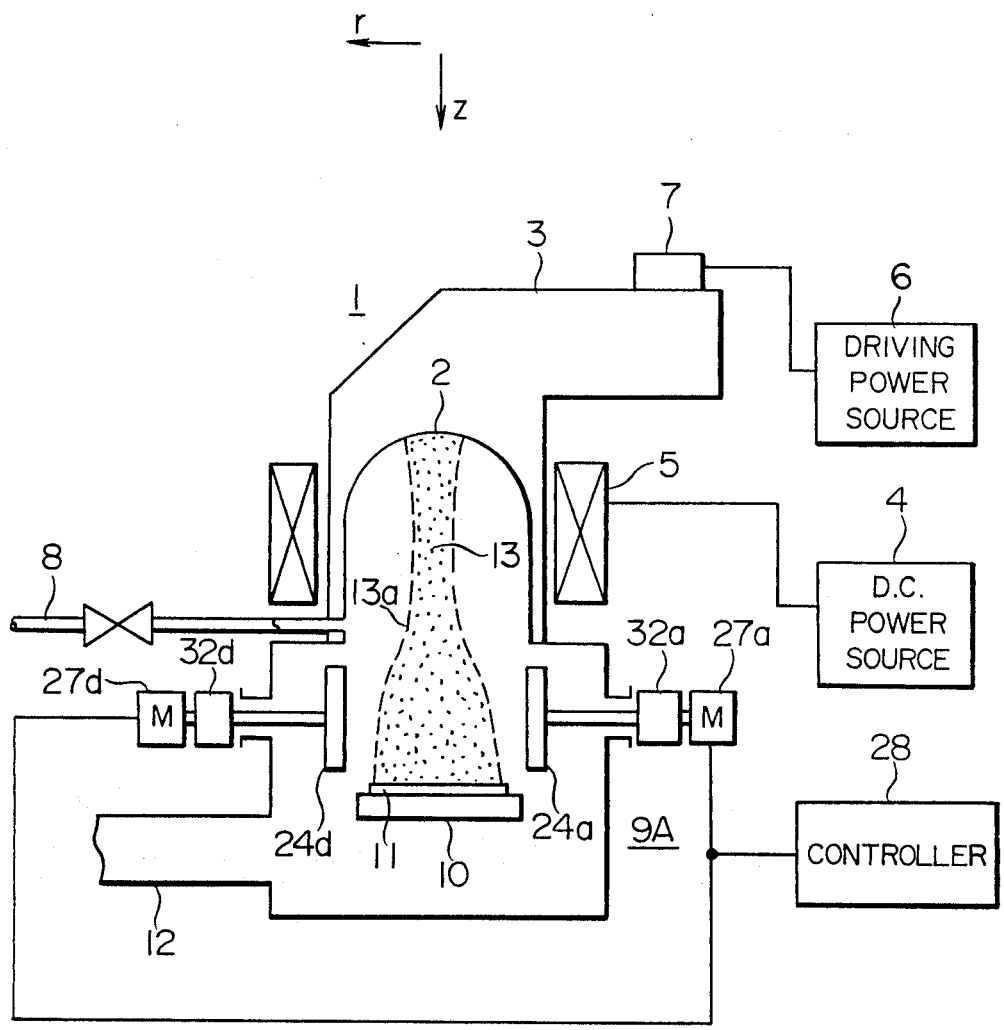
FIG. 23 is a sectional view, partly in blocks, showing the construction of a modification of the third embodiment shown in FIG. 17.

FIG. 23 is a sectional view, partly in blocks, showing the construction of a modification of the third embodiment illustrated in FIG. 17. The plasma generation portion 1 is quite the same as illustrated in FIG. 1, except that a plasma reaction portion 9A is provided with moving magnetic field generation means. More specifically, the plasma reaction portion 9A includes a stage 10 and a substrate 11, a plurality of magnetic plates (only plates 24a and 24d are shown in FIG. 23) which are made of a magnetic substance having a high permeability and which are arranged to surround a space between a plasma outlet port 13a and the substrate 11, rectilinear motion introducers (only introducers 32a and 32d are shown in FIG. 23) which serve to reciprocate the corresponding magnetic plates in directions perpendicular to the axis of a solenoid coil 5, driving motors (only motors 27a and 27d are shown in FIG. 23) which serve to drive the corresponding rectilinear motion introducers, and a controller 28 which serves to control all the driving motors.

Figure 24:
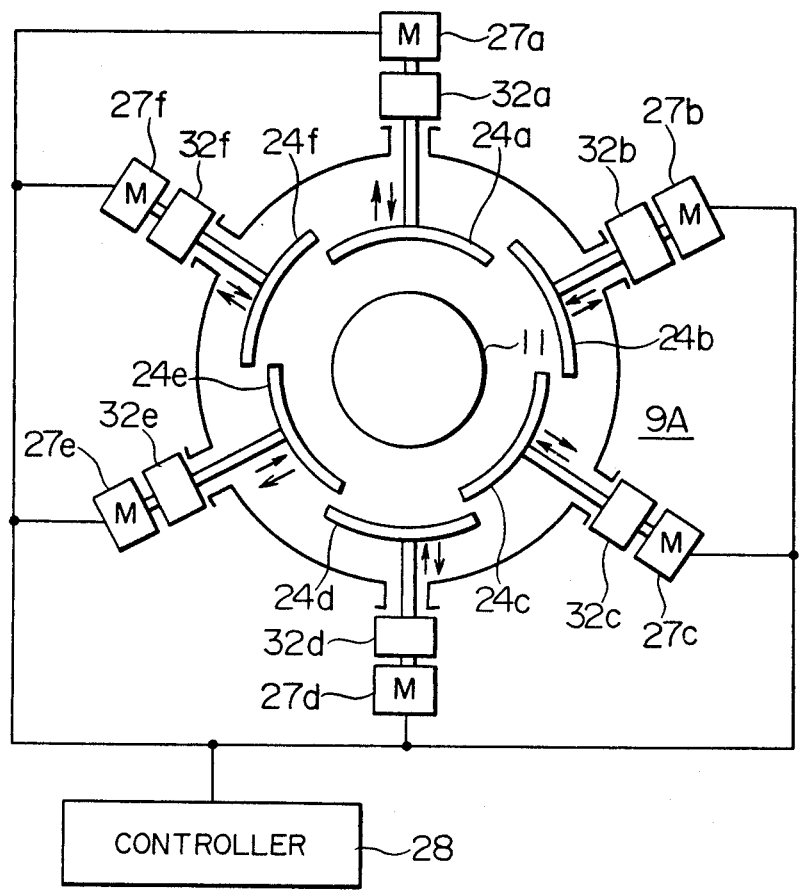
FIG. 24 is a plan view showing magnetic plates and a drive mechanism therefor which are used in the modification shown in FIG. 23.

FIG. 24 is a plan view showing the arrangement of the moving magnetic field generation means constructed of the high-permeability magnetic plates 24a-24f, rectilinear motion introducers 32a-32f, driving motors 24a-24f, and controller 28.

Figure 25:
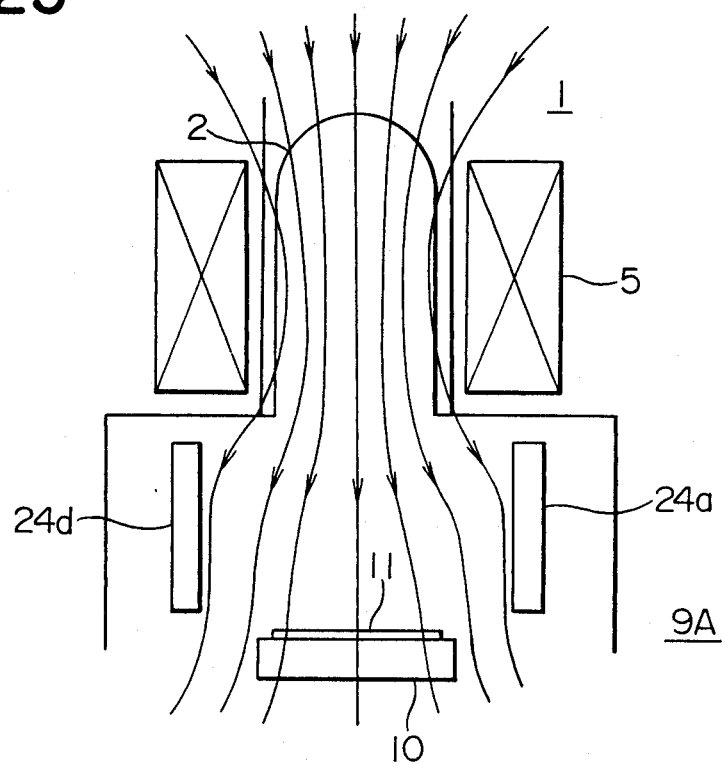
FIG. 25 is a diagram of the distribution of the lines of magnetic forces which develop when the magnetic plates lie on the outermost side in the modification of FIG. 23.
Figure 26:
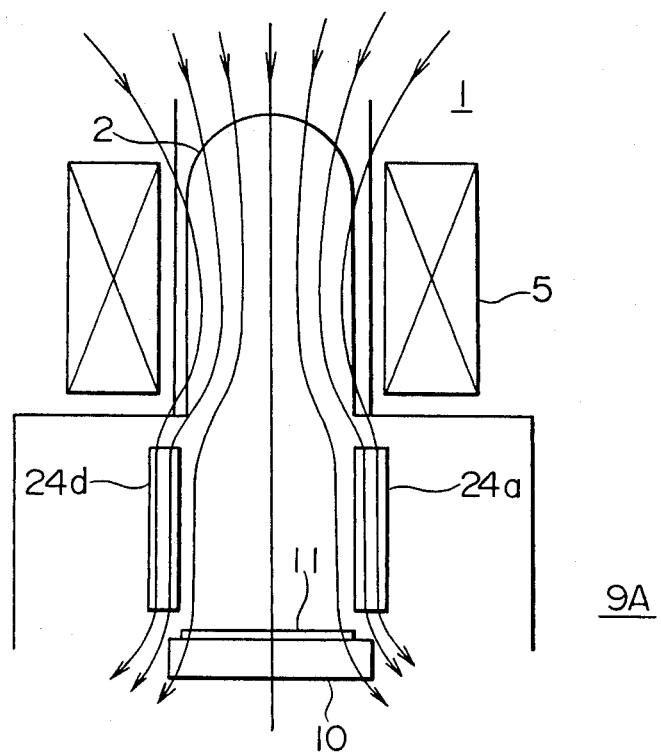
FIG. 26 is a diagram of the distribution of the lines of magnetic forces which develop when the magnetic plates lie on the innermost side in the modification of FIG. 23.

In the absence of the high-permeability magnetic plates as in the prior-art plasma processor, the lines of magnetic forces near the plasma generation portion 1 and plasma reaction portion 9A are distributed as illustrated in FIG. 4. In contrast, when the high-permeability magnetic plates 24a -24f are arranged around the space between the plasma lead-out port 13a and the substrate 11 as in the modification shown in FIG. 23, some of the lines of magnetic force pass through the magnetic substance of low reluctance 24a-24f, and the distribution of the lines of magnetic forces changes. Since a plasma flow 13 generated by electron cyclotron resonance is led into the plasma reaction portion 9A along the lines of magnetic forces, the diameter of the plasma flow 13 near the substrate 11 is also changed by the change of the distribution of the lines of magnetic forces. In a case where the magnetic plates 24a-24f are drawn to the outermost side by the driving motors 27a-27f, the lines of magnetic forces near the central part of the plasma generation portion 1 are hardly affected as illustrated in FIG. 25. Accordingly, the diameter of the plasma flow 13 in this case does not differ greatly from the diameter thereof in the absence of the magnetic plates. On the other hand, when the magnetic plates 24a-24f are located on the innermost side, even the lines of magnetic force near the central part are affected, and the distribution of the lines of magnetic force becomes as illustrated in FIG. 26. Accordingly, the diameter of the plasma flow 13 enlarges as compared with the diameter thereof arising when the magnetic plates 24a-24f are located on the outer side.

In this manner, according to the modification in FIG. 23, owing to the construction as shown in FIGS. 23 and 24, the magnetic plates 24a-24f are reciprocated in the r-direction by the driving motors 27a-27f to change the diameter of the plasma flow 13. By carrying out this motion as continuous reciprocations, the offset of the plasma flow 13 is eliminated, so that a uniform process can be performed and even the substrate 11 of large diameter can be processed. Moreover, since the plasma flow 13 is enclosed with the magnetic plates 14a-14f, the diffusion of the plasma can be prevented, and the plasma density near the substrate 11 increased. In turn, the processing rate of the substrate is raised.

Figure 27:
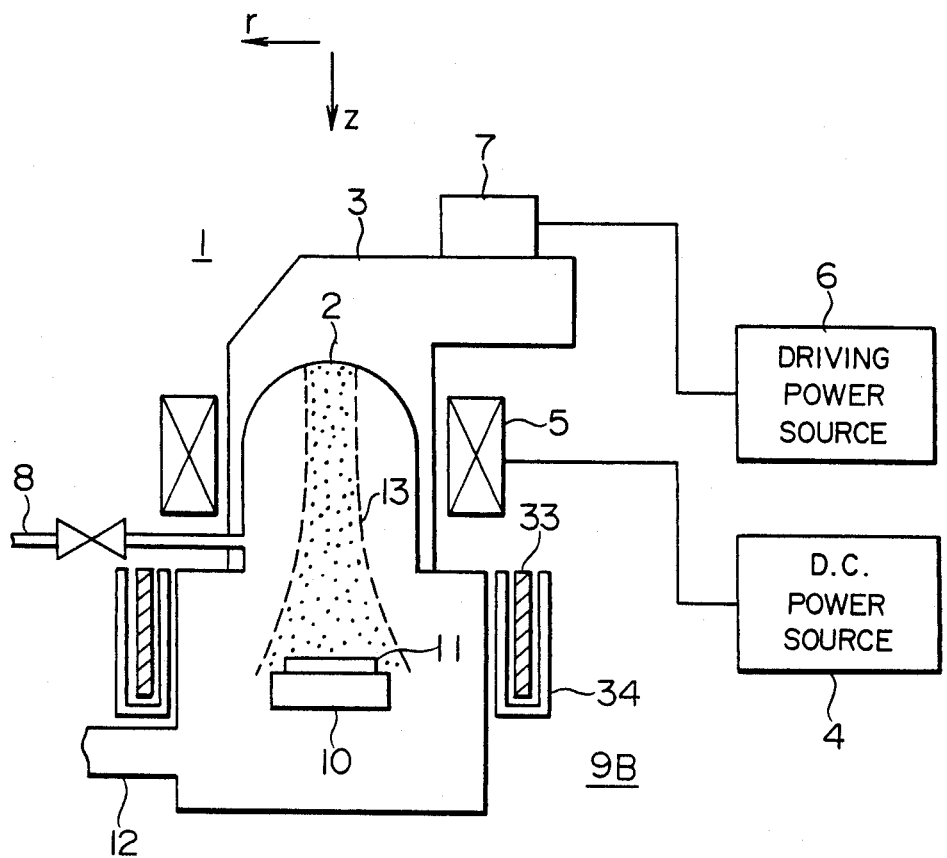
FIG. 27 is a sectional view, partly in blocks, showing the fourth embodiment of this invention.

FIG. 27 is a sectional view, partly in blocks, showing the construction of the fourth embodiment of this invention. In the figure, numerals 1-8, and 10-13 indicate quite the same elements as those shown in FIG. 1. The fourth embodiment further comprises a plasma reaction portion 9B, which includes a superconductor, for example, high-temperature superconductor 33 (having a transition temperature $T_c$ K)) that is arranged around the plasma reaction portion, and a cooling vessel 34 that accommodates the high-temperature superconductor 33. The cooling vessel 34 is mounted around the plasma reaction portion.

Figure 28:
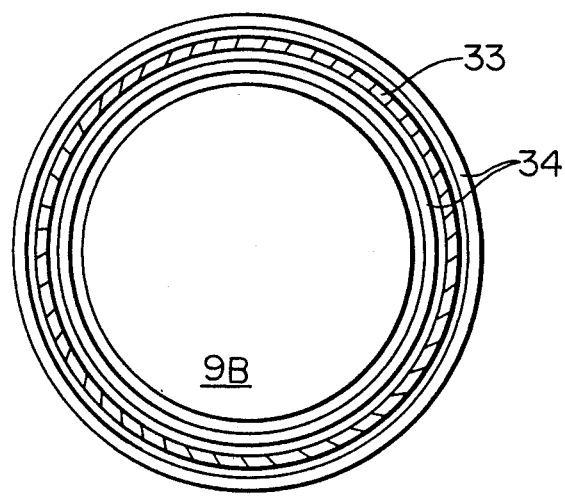
FIG. 28 is a plan view showing a plasma reaction portion, a high-temperature superconductor and a cooling vessel in the fourth embodiment.

FIG. 28 is a plan view showing the arrangement of the plasma reaction portion 9B, high-temperature superconductor 33 and cooling vessel 34 in the fourth embodiment.

Figure 29:
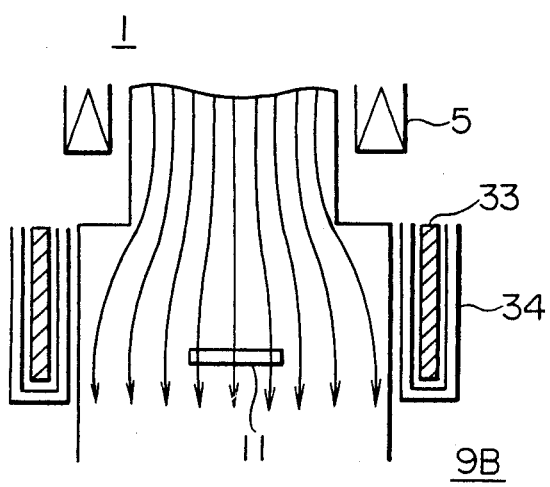
FIG. 29 is a sectional view for elucidating a magnetic flux which is generated in the fourth embodiment.

In the plasma processor constructed as stated above, the cooling vessel 34 is first filled up with liquid nitrogen to cool the high-temperature superconductor 33 below the transition temperature $T_c$ K. Then, the high-temperature superconductor 33 exhibits the perfect diamagnetism, and magnetic fluxes (indicated by arrows in FIG. 29) induced by the solenoid coil 5 converge in the vicinity of the substrate 11 as illustrated in FIG. 29, instead of expanding in the plasma reaction portion 9B as illustrated in FIG. 4. Accordingly, a plasma generated in the plasma generation portion 1 is affected by the magnetic fluxes, and the plasma flow 13 is shaped into a stable beam without spreading. Therefore, the sputtering of the plasma on chamber walls defining the plasma reaction portion 9B can be suppressed. Moreover, since the plasma density near the substrate 11 is increased, a highspeed plasma process becomes possible.

Thus, assuming by way of example that a gas introduced through the gas supply pipe 8 is $SiH_4$, ions such as $Si^+$, $SiH^+$, $SiH_2^+$ and $SiH_3^+$ and radicals such as $Si^*$ and $SiH_x^*$ are created in the plasma generation portion 1 by the electron cyclotron resonance, and the plasma flow 13 becomes a stable beam in the plasma reaction portion 9B under the influence of the magnetic fluxes formed by the solenoid coil 5 and the high-temperature superconductor 33. Therefore, the surface of the substrate 11 is not contaminated, and an amorphous silicon film is formed thereon at a high film-formation speed.

The plasma processor shown in FIG. 27 can be applied to various surface processes including plasma etching, plasma CVD and plasma oxidation, and can subject the substrate 11 to the plasma process without the contamination thereof and at the high processing speed.

The fourth embodiment has referred to the example in which the high-temperature superconductor 33 is arranged around the plasma reaction portion 9B in order that the magnetic fluxes induced by the solenoid coil 5 may converge in the vicinity of the substrate 11. However, another superconductor may well be arranged instead of the high-temperature superconductor 33. Besides, even when any substance other than the liquid nitrogen is employed for cooling the superconductor, effects similar to the foregoing are achieved.

As described above in detail, this invention comprises magnetostatic field generation means for generating a magnetostatic field, r.f. electric field formation means for generating an r.f. electric field which is perpendicular to the magnetostatic field, and moving magnetic field generation means for generating a moving magnetic field which intersects the magnetostatic field between the magnetostatic field generation means and a substrate, whereby a plasma current can be moved, and the diameter of the plasma current can be changed. These bring forth the effects that even a substrate of large diameter can be subjected to a uniform plasma process and that the diffusion of a plasma can be prevented.

In addition, this invention comprises magnetostatic field generation means for generating a magnetostatic field, r.f. electric field formation means for generating an r.f. electric field which is perpendicular to the magnetostatic field, and a superconductor arranged around a plasma reaction portion in which a plasma reacts, whereby a plasma current can be shaped into a stable beam. This brings forth the effects that the contamination of a substrate ascribable to chamber wall sputtering is eliminated and that the plasma process can be performed at a high processing speed.

What is claimed is:

1. A plasma processor for establishing an electron cyclotron resonance driven plasma in a reaction gas for treating a substrate disposed in the processor comprising:
   a chamber containing a plasma generation region in which a plasma is generated and a reaction region in which a substrate is disposed by the plasma;
   magnetostatic field generation means for generating a magnetostatic field in the chamber;
   electromagnetic electric field formation means for generating an electric field generally perpendicular to the magnetostatic field; and
   moving magnetic field generation means for generating a moving magnetic field intersecting the magnetostatic field between said magnetostatic field generation means and a substrate disposed in said chamber for deflecting the plasma across the substrate during treatment of the substrate by the plasma in said chamber including a permanent magnet disposed outside said chamber for generating a magnetic field in the plasma generation region of said chamber and means for rotating said permanent magnet around said chamber to produce the moving magnetic field, whereby the substrate is uniformly treated.

2. The plasma processor of claim 1 wherein said means for rotating includes gears for engaging and rotating said permanent magnet.

3. The plasma processor of claim 1 wherein said means for rotating includes rotating discs and an endless belt for coupling said discs and rotating said permanent magnet.

4. A plasma processor for establishing an electron cyclotron resonance driven plasma in a reaction gas for treating a substrate disposed in the processor comprising:
   a chamber containing a plasma generation region in which a plasma is generated and a reaction region in which a substrate is disposed by the plasma;
   magnetostatic field generation means for generating a magnetostatic field in the chamber;
   electromagnetic electric field formation means for generating an electric field generally perpendicular to the magnetostatic field; and
   moving magnetic field generation means for generating a moving magnetic field intersecting the magnetostatic field between said magnetostatic field generation means and a substrate disposed in said chamber for deflecting the plasma across the substrate during treatment of the substrate by the plasma in said chamber including a permanent magnet disposed outside said chamber for generating a magnetic field in the reaction region of said chamber and means for rotating said permanent magnet around said chamber to produce the moving magnetic field, whereby the substrate is uniformly treated.

5. The plasma processor of claim 4 wherein said means for rotating includes gears for engaging and rotating said permanent magnet.

6. The plasma processor of claim 4 wherein said means for rotating includes rotating discs and an endless belt for coupling said discs and rotating said permanent magnet.

7. A plasma processor for establishing an electron cyclotron resonance driven plasma in a reaction gas for treating a substrate disposed in the processor comprising:
   a chamber containing a plasma generation region in which a plasma is generated and a reaction region in which a substrate is disposed by the plasma;
   magnetostatic field generation means having a central axis relative to said chamber for generating a magnetostatic field in the chamber;
   electromagnetic electric field formation means for generating an electric field generally perpendicular to the magnetostatic field; and
   moving magnetic field generation means for generating a moving magnetic field intersecting the magnetostatic field between said magnetostatic field generation means and a substrate disposed in said chamber for deflecting the plasma across the substrate during treatment of the substrate by the plasma in said chamber including a plurality of magnetic plates of high permeability for generating a magnetic field in the plasma generation region of said chamber and drive means for reciprocatingly moving said magnetic plates along directions generally perpendicular to the axis of said magnetostatic field generation means to produce the moving magnetic field, whereby the substrate is uniformly treated.

8. The plasma processor of claim 7 wherein said drive means includes a plurality of movable supports, each supporting at least one magnetic plate, a plurality of shafts, each threadedly engaging at least one of said supports, a motor for rotating each shaft, and a controller for controlling operation of said motors.

9. The plasma processor of claim 7 wherein said drive means includes a stationary ring and a movable ring, each of said magnetic plates being respectively pivotally attached to said stationary and movable rings, a motor for rotating said movable ring relative to said stationary ring, and a controller for controlling said motor.

10. A plasma processor for establishing an electron cyclotron resonance driven plasma in a reaction gas for treating a substrate disposed in the processor comprising:
   a chamber containing a plasma generation region in which a plasma is generated and a reaction region in which a substrate is disposed by the plasma and including an outlet port for outputting the plasma from the plasma generation region to the reaction region;
   magnetostatic field generation means having a central axis relative to said chamber for generating a magnetostatic field in the chamber;
   electromagnetic electric field formation means for generating an electric field generally perpendicular to the magnetostatic field; and
   moving magnetic field generation means for generating a moving magnetic field intersecting the magnetostatic field between said magnetostatic field generation means and a substrate disposed in said chamber for deflecting the plasma across the substrate during treatment of the substrate by the plasma in said chamber including a plurality of magnetic plates of high permeability for generating a magnetic field between the outlet port and a substrate in the reaction region of said chamber and drive means for reciprocatingly moving said magnetic plates along directions generally perpendicular to the axis of said magnetostatic field generation means to produce the moving magnetic field, whereby the substrate is uniformly treated.

* * * * *